United States Patent
Kim et al.

(10) Patent No.: US 8,294,131 B2
(45) Date of Patent: Oct. 23, 2012

(54) INTEGRATED CIRCUIT DEVICES INCLUDING LOW-RESISTIVITY CONDUCTIVE PATTERNS IN RECESSED REGIONS

(75) Inventors: Kang-Uk Kim, Seoul (KR); Yongchul Oh, Suwon-si (KR); Hui-Jung Kim, Seongnam-si (KR); Hyun-Woo Chung, Seoul (KR); Hyun-Gi Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 171 days.

(21) Appl. No.: 12/826,896

(22) Filed: Jun. 30, 2010

(65) Prior Publication Data

US 2011/0017971 A1 Jan. 27, 2011

(30) Foreign Application Priority Data

Jul. 23, 2009 (KR) ........................ 10-2009-0067407

(51) Int. Cl.
*H01L 29/02* (2006.01)
(52) U.S. Cl. .. 257/2; 257/3; 257/4; 257/5; 257/E29.002; 438/102; 438/103
(58) Field of Classification Search .................. 257/2–5, 257/E29.002; 438/102–103
See application file for complete search history.

(56) References Cited

U.S. PATENT DOCUMENTS

| 5,736,761 | A | 4/1998 | Risch et al. |
| 6,355,520 | B1 | 3/2002 | Park et al. |
| 7,371,627 | B1 | 5/2008 | Forbes |
| 2007/0184627 | A1* | 8/2007 | Cho et al. ...................... 438/399 |
| 2008/0315282 | A1* | 12/2008 | Cho et al. ...................... 257/315 |

FOREIGN PATENT DOCUMENTS

| JP | 11-054728 | 2/1999 |
| KR | 1020070003065 A | 1/2007 |
| KR | 1020070047572 A | 5/2007 |

* cited by examiner

*Primary Examiner* — Bradley K Smith
*Assistant Examiner* — Jami M Valentine
(74) *Attorney, Agent, or Firm* — Myers Bigel Sibley & Sajovec, P.A.

(57) ABSTRACT

An integrated circuit device includes a device isolation pattern on a semiconductor substrate to define an active area therein. The active area includes a doped region therein. A conductive pattern extends on the active area and electrically contacts the doped region. The conductive pattern has a lower resistivity than the doped region. The conductive pattern may be disposed in a recessed region having a bottom surface lower than a top surface of the active area. A channel pillar electrically contacts to the doped region and extends therefrom in a direction away from the substrate. A conductive gate electrode is disposed on a sidewall of the channel pillar, and a gate dielectric layer is disposed between the gate electrode and the sidewall of the channel pillar.

18 Claims, 23 Drawing Sheets

1st direction
2nd direction

INTEGRATED CIRCUIT DEVICES INCLUDING LOW-RESISTIVITY CONDUCTIVE PATTERNS IN RECESSED REGIONS

CROSS-REFERENCE TO RELATED APPLICATIONS

This U.S. non-provisional patent application claims priority under 35 U.S.C. §119 from Korean Patent Application No. 10-2009-0067407, filed on Jul. 23, 2009, the entire contents of which are hereby incorporated by reference as if set forth fully herein.

BACKGROUND

The present disclosure relates to integrated circuit devices, and more particularly, to field-effect transistor devices.

Integrated circuit devices are used in various electronics industries for reasons including device miniaturization and/or reduced manufacturing costs and the like. Integrated circuit devices may include memory devices for storing data, logic devices for processing data, and hybrid devices capable of performing various functions simultaneously.

As advances in the electronics industry continue, demand for higher device integration may increase. This may cause several problems, such as reduced process margins in exposure processes for patterning fine patterns. As such, it may become more difficult to fabricate integrated circuit devices. Accordingly, to satisfy demand for high integration and high speed operation, various research is being conducted.

SUMMARY

Embodiments of the inventive concept provide integrated devices having a high degree of integration.

Embodiments of the inventive concept also provide integrated circuit devices capable of high speed operation while providing a high degree of integration.

According to some embodiments, an integrated circuit device includes a substrate and a device isolation pattern on the substrate defining an active area therein. The active area includes a doped region therein. A conductive pattern extends on the active area and electrically contacts the doped region. The conductive pattern has a lower resistivity than the doped region. A channel pillar electrically contacts the doped region and extends therefrom in a direction away from the substrate. A conductive gate electrode extends on a sidewall of the channel pillar, and a gate dielectric layer extends between the gate electrode and the sidewall of the channel pillar.

In some embodiments, the conductive pattern may be disposed in a recessed region having a bottom surface that is lower than a top surface of the active area.

In some embodiments, the doped region, the recessed region, and the low resistivity conductive layer may extend in a first direction, and the gate electrode may extend in a second direction that is substantially perpendicular to the first direction.

In some embodiments, the conductive pattern may include an upper surface and a lower surface. The lower surface of the conductive pattern may be below a top surface of the device isolation pattern and the top surface of the active area. The bottom surface of the recessed region may include a recessed surface of the device isolation pattern.

In some embodiments, the active area may include a recessed surface lower than the top surface of the active area. The bottom surface of the recessed region may include the recessed surface of the device isolation pattern and the recessed surface of the active area.

In some embodiments, the recessed region may include a first sidewall extending between the top and recessed surfaces of the device isolation pattern, and a second sidewall extending between the top and recessed surfaces of the active area. First and second sidewall spacers may electrically separate the conductive pattern from the first and second sidewalls of the recessed region, respectively, such that the conductive pattern may contact the recessed surface of the active area and the recessed surface of the device isolation pattern.

In some embodiments, the active area may include a recessed surface lower than the top surface of the active area. The bottom surface of the recessed region may include the recessed surface of the active area.

In some embodiments, the recessed region and the conductive pattern may extend in a first direction, the gate electrode may extend in a second direction substantially perpendicular to the first direction, and the doped region and the active area may extend in a third direction that is not perpendicular to the first direction and is not parallel to the first direction.

In some embodiments, the device isolation pattern may include a top surface and a recessed surface. The recessed surface of the device isolation pattern may be lower than the top surface of the device isolation pattern and a top surface of the active area. The bottom surface of the recessed region may include the recessed surface of the device isolation pattern.

In some embodiments, the conductive pattern may be in contact with a sidewall of the active area, and an entirety of the top surface of the active area may be a substantially planar surface.

In some embodiments, the recessed region and the conductive pattern may extend in the first direction across the active area. The active area may include a recessed surface lower than the top surface thereof. The bottom surface of the recessed region may further include the recessed surface of the active area.

In some embodiments, an insulating layer may electrically isolate the gate electrode from the active area, and may electrically isolate the gate electrode from the conductive pattern.

In some embodiments, a hard mask pattern may extend on the top surface of the active area. The channel pillar may contact the top surface of the active area and may extend through the hard mask pattern. A top surface of the hard mask pattern may be substantially coplanar with a top surface of the conductive pattern and with a top surface of the device isolation pattern.

In some embodiments, the gate electrode may include a first portion and a second portion adjacent thereto extending in a first direction. The first portion may surround the channel pillar and may have a first width along a second direction that is substantially perpendicular to the first direction. The second portion may have a second width narrower than the first width along the second direction.

In some embodiments, the doped region may have a lower boundary opposite the top surface of the active area. The lower boundary of the doped region may be below the bottom surface of the recessed region.

In some embodiments, a data storage element may be electrically connected to a top surface of the channel pillar. The data storage element may be one of a capacitor and a variable resistivity memory element.

In some embodiments, the data storage element may be a resistive random access memory (RRAM) element, a phase changeable random access memory (PRAM) element, and/or a magnetic random access memory (MRAM) element.

In some embodiments, the data storage element may include a string of serially connected memory cells.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the figures:

FIGS. 16A through 20A are cross-sectional views taken along line V-V' of FIG. 12, illustrating a method of fabricating a semiconductor device according to other embodiments of the inventive concepts;

FIGS. 16B through 20B are cross-sectional views taken along line VI-VI', illustrating a method of fabricating a semiconductor device according to other embodiments of the inventive concepts.

DETAILED DESCRIPTION OF EMBODIMENTS

Figure 1:
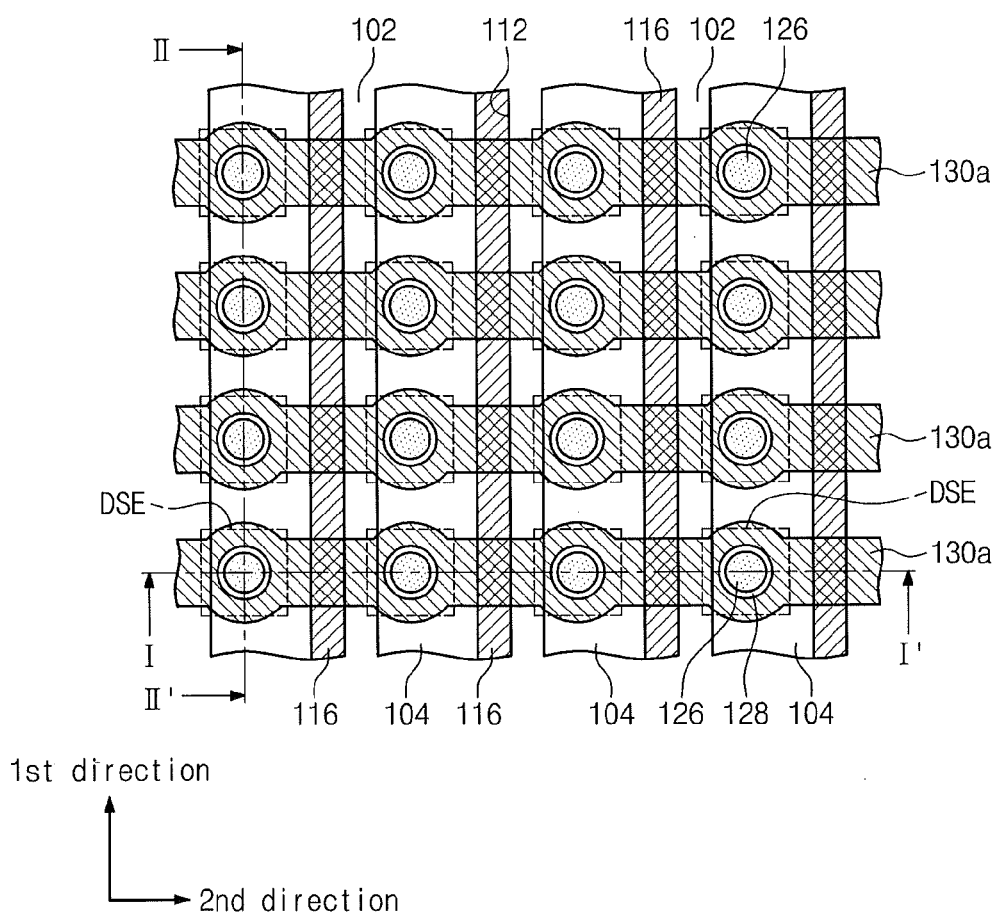
FIG. 1 is a top plan view illustrating a semiconductor device according to some embodiments of the inventive concept.

Exemplary embodiments of the inventive concept will be described below in more detail with reference to the accompanying drawings. The embodiments of the inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the inventive concept will be described in detail with reference to the accompanying drawings.

Embodiment 1

Figure 2A:
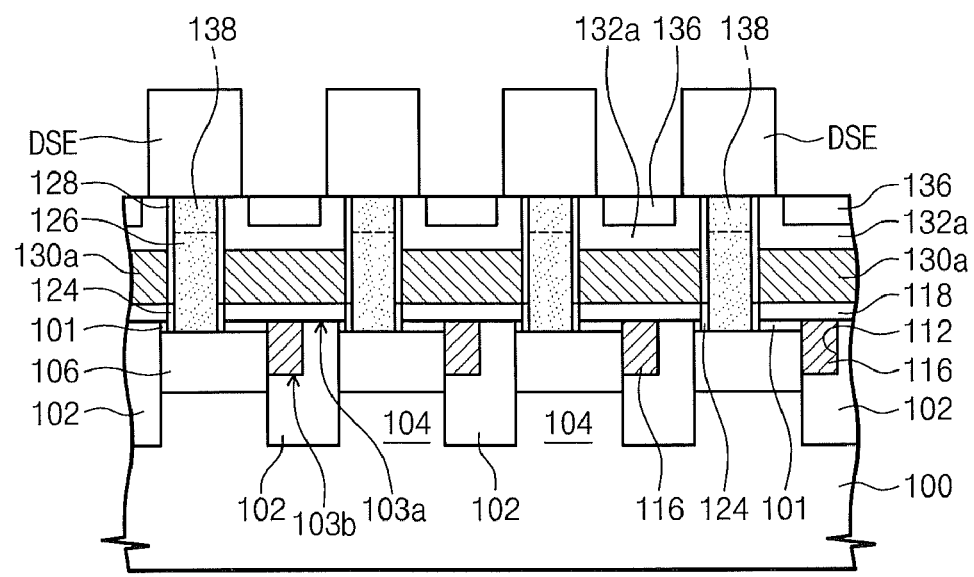
FIG. 2A is a cross-sectional view taken along line I-I' of FIG. 1.
Figure 2B:
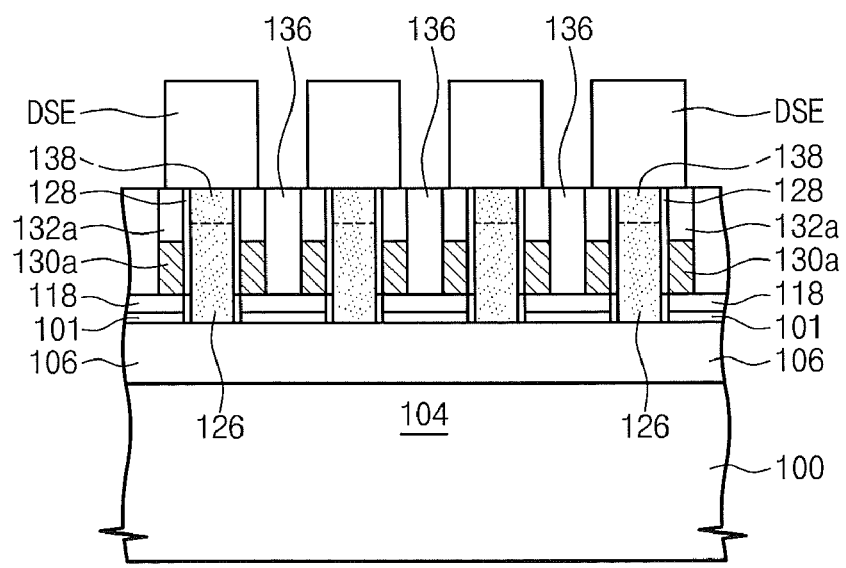
FIG. 2B is a cross-sectional view taken along line II-II' of FIG. 1.

FIG. 1 is a top plan view illustrating a semiconductor device according to some embodiments of the inventive concept, FIG. 2A is a cross-sectional view taken along line I-I' of FIG. 1, and FIG. 2B is a cross-sectional view taken along line II-II' of FIG. 1.

Referring to FIGS. 1, 2A and 2B, a device isolation pattern 102 is disposed on a semiconductor substrate 100 to define active portions or areas 104. The active area 104 may be a portion of the semiconductor substrate 100, which is surrounded by the device isolation pattern 102. The active area 104 is doped with dopants of a first conductivity type, such as n-type or p-type. The active areas 104 may be extended in a first direction. The active areas 104 may be separated from each other along a second direction that is substantially perpendicular to the first direction. The device isolation pattern 102 may be disposed between the active areas 104. The first direction and the second direction are parallel with the top surface of the semiconductor substrate 100. The semiconductor substrate 100 is formed of semiconductor material. For example, the semiconductor substrate may be formed of silicon and/or germanium. The device isolation pattern 102 may be a trench type isolation pattern. The device isolation pattern 102 may be an oxide layer filling a trench that is formed on the semiconductor substrate 100. The device isolation pattern 102 may further include a sidewall thermal oxide formed on the inner surface of the trench. The device isolation pattern 102 may also include a liner, which is interposed between the inner surface of the trench and the filling oxide. The liner may be formed of nitride, oxy-nitride and/or oxide denser than the filling oxide. The filling oxide may be formed of an oxide with excellent gap-fill characteristics. The filling oxide may be formed of high density plasma oxide and/or spin on glass (SOG).

A doped region 106 is formed in the active area 104. The doped region 106 is doped with dopants of a second conductivity type that is different than the first conductivity type. One of the first conductivity and the second conductivity is n type and the other is p type. The doped region 106 may be a linear shape extended along a longitudinal direction of the active area 104. Thus the doped region 106 may be extended in the first direction. A lower boundary of the doped region 106 may be higher than a bottom surface of the device isolation pattern 102. A top surface of the doped region 106 may be substantially coplanar with a top surface of the active area 104. The doped region 106 may be formed self-aligned with the active area 104. Thus, a width of the doped region 106 in the second direction may be substantially equal to a width of the active area in the second direction.

A low resistivity conductive pattern 116 is disposed in a recessed region 112 of the device isolation pattern 102. The recessed region 112 has a bottom surface lower than the top surface of the active area 104. The low resistivity conductive pattern 116 is in contact with the doped region 106. The recessed region 112 may be a groove shaped region that extends along the first direction. The low resistivity conductive pattern 116 may also extend along the recessed region 112. Thus, the low resistivity conductive pattern 116 and the doped region 106 may be in contact with each other while being extended in parallel. A contact surface between the low resistivity conductive pattern 116 and the doped region 106 may also extend in the first direction. The low resistivity conductive pattern 116 may fill the recessed region 112 completely. Alternatively, according to some other embodiments of the inventive concept, the low resistivity conductive pattern 116 may partially fill the recessed region 112.

The recessed region 112 may include a bottom surface, a first inner sidewall and a second inner sidewall. The device isolation pattern 102 may include a top surface 103a and a recessed surface 103b lower than the top surface 103a. The recessed surface 103b of the device isolation pattern 102 is lower than the top surface of the active area 104. The top surface 103a and the recessed surface 103b of the device isolation pattern 102 may be substantially parallel with each other. The bottom surface of the recessed region 112 may be defined by and/or include the recessed surface 103b of the device isolation pattern 102. The device isolation pattern 102 may include a sidewall, which connects the top surface 103a and the recessed surface 103b. The first inner sidewall of the recessed region 112 may include the sidewall of the device isolation pattern 102, which connects the top surface 103a and the recessed surface 103b of the device isolation pattern 102. The second inner sidewall of the recessed region 112 may be formed of a portion of one sidewall of the active area 104, which corresponds to a portion of one sidewall of the doped region 106. The low resistivity conductive pattern 116 may be in contact with the second inner sidewall of the recessed region 112, such that the low resistivity conductive pattern 116 may be in contact with the doped region 106. The bottom surface of the recessed region 112 may be higher than the lower boundary of the device isolation pattern 102. The bottom surface of the recessed region 112 may be higher than the bottom surface of the doped region 106. Thus, a sidewall of the doped region 106 adjacent to the recessed region 112 may be in contact with the low resistivity conductive pattern 116 and the device isolation pattern 102.

The low resistivity conductive pattern 116 may include conductive material having a resistivity lower than a resistivity of the doped region 106. For example, the low resistivity conductive pattern 116 may be formed of at least one of a metal (such as tungsten, titanium, tantalum, noble metal, aluminum and copper, etc.), a conductive metal nitride (such as titanium nitride, tantalum nitride and tungsten nitride, etc.), and a metal-semiconductor compound (such as tungsten silicide, cobalt silicide and nickel silicide, etc).

A channel pillar 126 is disposed on the active area 104. A plurality of the channel pillars 126 may be arranged in two dimensions, that is, along the first direction and the second direction. The channel pillars 126 are spaced apart from each other. The channel pillars 126 may each be disposed on one of the active areas 104. The channel pillars 126 on each of the active areas 104 may be arranged along the first direction to form columns extending in a direction away from the substrate 100. The channel pillar 126 is in contact with the top surface of the active area 104. As such, the channel pillar 126 is electronically connected to the doped region 106. The channel pillar 126 may be formed of semiconductor material. The channel pillar 126 may be formed of semiconductor material substantially identical to that of the semiconductor substrate 100 in some embodiments. The channel pillar 126 may be in a single-crystalline state. The channel pillar 126 may be doped with dopants of a different conductivity type than the doped region 106. That is, the channel pillar 126 may be doped with dopants of the first conductivity type. Alternatively, the channel pillar 126 may be in an undoped state. In FIG. 1, the top surface of the channel pillar 126 may be substantially circular in a plan view. Alternatively, the top surface of the channel pillar 126 may be embodied in an ellipsoid or polygonal shape in some other embodiments A gate electrode 130a surrounds or extends at least partially around a sidewall of the channel pillar 126. A plurality of the gate electrodes 130a may extend in the second direction to cross over the active areas 104. Each of the gate electrodes 130a surrounds the sidewalls of the channel pillars 126 which are arranged in the second direction to form a row. A gate dielectric layer 128 is located between the sidewall of the channel pillar 126 and the gate electrode 130a. The channel pillar 126 may have a protrusion which is higher than the top surface of the gate electrode 130a. Thus the top surface of the channel pillar 126 may be higher than the top surface of the gate electrode 130a. A source/drain region 138 may be disposed in the protrusion of the channel pillar 126. The source/drain region 138 may be doped with dopants of the same conductivity type as the doped region 106. Thus, the source/drain region 138 may be doped with dopants of the second conductivity type. The channel pillar 126 and the gate electrode 130a surrounding the channel pillar 126 may define a vertical field effect transistor. The vertical field effect transistor may include the doped region 106, the channel pillar 126, the gate electrode 130a, the gate dielectric layer 128 and the source/drain region 138. A channel of the vertical field effect transistor may be generated at the sidewall of the channel pillar while the vertical field effect transistor is operating, that is, responsive to application of a sufficient voltage to the gate electrode 130a.

The gate dielectric layer 128 may include a thermal oxide, a nitride and/or an oxy-nitride. The gate electrode 130a may be formed of at least one of a doped semiconductor; metal (such as tungsten, aluminum, titanium, tantalum, etc.), a conductive metal nitride (such as titanium nitride, tantalum nitride, tungsten nitride, etc.), and a metal-silicon compound (such as tungsten silicide, cobalt silicide, nickel silicide, etc).

A hard mask pattern 101 may be disposed on the top surface of the active area 104. The hard mask pattern 101 is disposed under the gate electrode 130a. The channel pillar 126 may penetrate and extend through the hard mask pattern 101, such that the channel pillar 126 may be in contact with the top surface of the active area 104. The top surface of the active area 104 may be self-aligned with the hard mask pattern 101. The top surface of the hard mask pattern 101 may be coplanar with the top surface 103a of the device isolation pattern 102. In embodiments where the recessed region 112 is completely filled with the low resistivity conductive pattern 116, the top surface of the hard mask pattern 101 may be coplanar with the top surface 103a of the device isolation pattern 102 and the top surface of the low resistivity conductive pattern 116. The hard mask pattern 101 may include an insulating material having an etching selectivity with respect to the active area 104. For example, the hard mask pattern 101 may be formed of oxide or oxide/nitride.

An insulating layer 118 may be disposed between the gate electrode 130a and the active area 104, between the gate electrode 130a and the low resistivity conductive pattern 116, and between the gate electrode 130a and the top surface 103a of the device isolation pattern 102. The insulating layer 118 may substantially cover the entire surface of the semiconductor substrate 100. The channel pillar 126 may penetrate or extend through the insulating layer 118 and the hard mask pattern 101, such that the channel pillar 126 is in contact with the top surface of the active area 104. The insulating layer 118 may be formed of a nitride and/or an oxy-nitride. A hole spacer 124 may be disposed between the insulating layer 118 and the channel pillar 116, and between the hard mask pattern 101 and the channel pillar 116. The hole spacer 124 may be formed of an oxide, a nitride and/or an oxy-nitride A capping insulating pattern 132a may be disposed on the gate electrode 130a. The capping insulating pattern 132a may be disposed on the top surface of the gate electrode 130a and may surround a side wall of the protrusion of the channel pillar 126. The capping insulating pattern 132a may have a sidewall in self alignment with the sidewall of the gate electrode 130a. The capping insulating pattern 132a may be disposed conformally along the sidewall of the protrusion of the channel pillar 126 including the source/drain region 138 therein and the top surface of the gate electrode 130a. As such, a concave region in the capping insulating pattern 132a may be disposed between a pair of the channel pillars 126 adjacent to each other in a row. An interlayer dielectric layer 136 may fill the concave region and areas between the gate electrodes 130a. The interlayer dielectric layer 136 may have a planarized top surface. The interlayer dielectric layer 136 may not cover the top surface of the channel pillar 126. Additionally, the interlayer dielectric layer 136 may not cover the uppermost surface of the capping insulating pattern surrounding the channel pillar 126. In FIGS. 2A and 2B, the top surface of the interlayer dielectric layer 136 has a level substantially planar with the top surface of the channel pillar 126 and the uppermost surface of the capping insulating pattern 132a. Alternatively, the top surface of the interlayer dielectric layer 136 may be higher than the top surface of the channel pillar 126 and/or the uppermost surface of the capping insulating pattern 132a in some other embodiments. The interlayer dielectric layer 136 may be formed of an oxide. The capping insulating pattern 132a may be formed of a nitride and/or an oxy-nitride.

The gate electrode 130a may include a first portion and a second portion. The first portion of the gate electrode 130a surrounds the channel pillar 126. The second portion of the gate electrode 130a is disposed on the device isolation pattern 102 located at a side of the first portion and provides a connection to an adjacent first portion. The first portion of the gate electrode 130a has a first width in the first direction, and the second portion of the gate electrode 130a has a second width in the first direction. The first width may be wider than the second width. A portion of the capping insulating pattern 132a surrounding the channel pillar 126 may be disposed on the first portion of the gate electrode 130a. Another portion of the capping insulating pattern 132a may be disposed on the second portion of the gate electrode 130a.

A data storage element DSE may be connected to the top surface of the channel pillar 126. A plurality of data storage elements DSE may be arranged in two dimensions on the semiconductor substrate 100. The data storage element DSE is an element for storing data. The data storage element DSE may be electrically connected to a source/drain region 138 which is formed in the channel pillar 126. The data storage element DSE may be in contact with the top surface of the channel pillar 126 in some embodiments.

As shown, the channel pillar 126 can be formed in single crystalline state by contacting to the top surface of the active area 104. In addition, the doped region 106 connected to the bottom surface of the channel pillar is in contact with the low resistivity conductive pattern 116 in the recessed region 106 having the bottom surface lower than the top surface of the active area 104. A contact surface between the doped region 106 and the low resistivity conductive pattern 116 extends along the longitude length of the doped region 106. The resistance of the doped region 106 is reduced by the low resistivity conductive pattern 116. Therefore, vertical field effect transistors according to embodiments of the inventive concept may be capable of higher speed operation and may offer superior characteristics. Such vertical field effect transistors may also provide higher integration. As a result, a semiconductor device including such vertical field effect transistors may also be capable of high speed operation and may provide high integration.

Additionally, the low resistivity conductive pattern 116 does not induce a step difference because the low resistivity conductive pattern 116 is disposed in the recessed region 112. Therefore, a process margin for fabricating the semiconductor device can be improved.

The data storage element DSE may be formed of various types. For example, the data storage element DSE may be a capacitor or a variable-resistivity memory element, such as a resistive RAM (RRAM) element, a phase-changeable RAM (PRAM) element, and/or a magnetic RAM (MRAM) element.

Figure 3A:
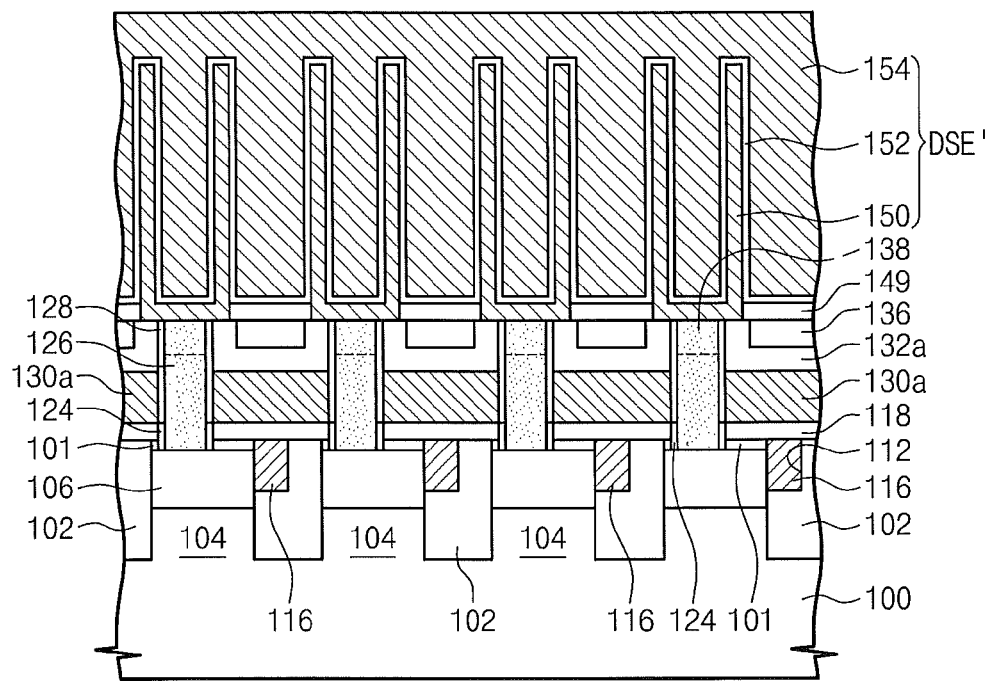
FIG. 3A is a cross-sectional view taken along line I-I' of FIG. 1, illustrating some embodiments of data storage elements.

FIG. 3A is a cross-sectional view taken along line I-I' of FIG. 1, illustrating data storage elements according to some embodiments.

Referring to FIG. 3A, a data storage element DSE' according to some embodiments may be a capacitor. The data storage element DSE' may include a lower electrode 150, an upper electrode 154 and a capacitor dielectric layer 152 between the lower electrode 150 and the upper electrode 154. Each of the lower electrodes 150 may be in contact with one of the channel pillars 126. The upper electrode 154 may cover the surfaces of a plurality of the lower electrodes 150. In some embodiments where the data storage element DSE' is capacitor, the doped region 106 and the low resistivity conductive pattern 116 in contact with each other may correspond to a bit line, and the gate electrode 130a may correspond to a word line.

The lower electrode 150 may have a cylindrical shape. Alternatively, the lower electrode 150 may be stack-shaped or planar-shaped. An etch stop layer 149 may be disposed on the interlayer dielectric layer 136. The etch stop layer 149 may cover the entire top surface of the interlayer dielectric layer 136. The lower electrode 150 may penetrate and extend through the etch stop layer 149, such that the lower electrode 150 is in contact with the top surface of the channel pillar 126. The etch stop layer 149 may be formed of an insulating material which has high etch selectivity with respect to the interlayer dielectric layer 136. For example, the etch stop layer 149 may be formed of nitride and/or oxy-nitride.

The lower electrode 150 may include at least one of doped semiconductor; metal (such as platinum, iridium, titanium and tantalum, etc.), conductive metal nitride (such as titanium nitride and tantalum nitride, etc.), and conductive metal oxide (such as iridium oxide, etc.). The upper electrode 154 may include at least one of doped semiconductor, metal (such as platinum, iridium, titanium and tantalum, etch), conductive metal nitride (such as titanium nitride and tantalum nitride, etc), and conductive metal oxide (such as iridium oxide, etc.). The capacitor dielectric layer 152 may include oxide, nitride, oxy-nitride, high-k dielectric material (such as hafnium oxide, aluminum oxide, and other metal oxide) and/or ferro-electric material.

Figure 3B:
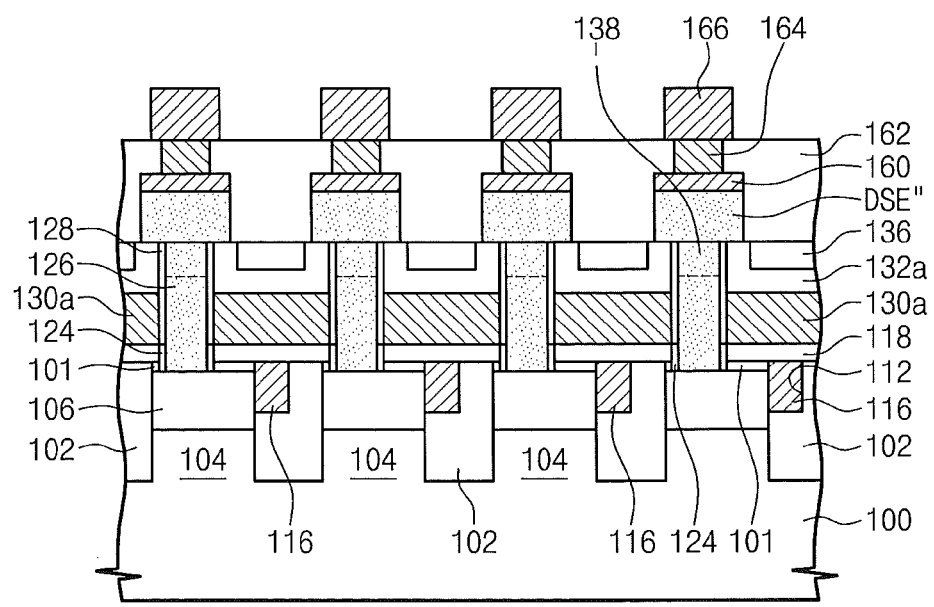
FIG. 3B is a cross-sectional view taken along line I-I' of FIG. 1, illustrating other embodiments of data storage elements.

FIG. 3B is a cross-sectional view taken along line I-I' of FIG. 1, illustrating data storage elements according to other embodiments.

Referring to FIG. 3B, according to this embodiment, a data storage element DSE" may be a variable resistivity element or layer. The variable resistivity element is changeable into a plurality of states having different resistivity. A capping electrode 160 may be disposed on the data storage element DSE". The capping electrode 160 may have a sidewall that is self-aligned with the sidewall of the data storage element DSE". The upper interlayer dielectric layer 162 may be disposed on the data storage element DSE". A contact plug 164 may be in contact with the capping electrode 160 through the upper interlayer dielectric layer 162. An interconnection line 166 may be disposed on the upper interlayer dielectric layer 162 to be connected to the contact plug 164. The interconnection line 166 may extend in the first direction of FIG. 1. A plurality of interconnection lines 166 may extend in the first direction on the upper interlayer dielectric layer 162. Each of the interconnection lines 166 may be connected to a respective one of the data storage elements DSE", which are arranged in the first direction to form a column. In some embodiments where the data storage element DSE" is a variable resistivity element, one of the interconnection line 166 and the doped region 106 may correspond to a bit line, the other may correspond to a source line. The gate electrode 130a may correspond to a word line.

The data storage element DSE" may be a magnetic tunnel junction pattern in some embodiments. More particularly, the magnetic tunnel junction pattern of the data storage element DSE" may include a reference layer with a fixed magnetic direction, a free layer capable of changing a magnetic direction, and a tunnel barrier disposed between the reference layer and the free layer. One of the free layer and the reference layer may be electrically connected to the top surface of the channel pillar 126, and the other may be connected to the capping electrode 160. The magnetic direction of the free layer may be changeable using spins of electrons passing through the magnetic tunnel junction pattern. The free layer may be formed of ferromagnetic material. The reference layer may be single-layered or multi-layered. When the reference layer is multi-layered, the reference layer may include a pinning layer and a pinned layer. The pinning layer may be formed of antiferromagnetic material, and the pinning layer may be formed of ferromagnetic material. The magnetic direction of the pinned layer can be fixed by the pinning layer. The pinned layer may be single-layered or multi-layered. When the pinned layer is multi-layered, the pinned layer may be include a first pinned layer, a second pinned layer, and a non-magnetic layer disposed between the first pinned layer and the second pinned layer. The magnetic direction of the first pinned layer is fixed by the pinning layer, the non-magnetic layer couples the second pinned layer with the second pinned layer to cross magnetic directions therebetween. For example, the non-magnetic layer may be formed of ruthenium. The tunnel barrier may include aluminum oxide and/or magnesium oxide. A lower electrode may be disposed between the data storage element DSE" and the top surface of the channel pillar 126.

In further embodiments, the data storage element DSE" may be formed of a variable resistivity element which is capable of changing the state of resistance by forming or breaking at least one filament or conduction path therein. For example, the data storage element DSE" may include at least one of niobium oxide, titanium oxide, nickel oxide, zirconium oxide, vanadium oxide, PCMO ((Pr,Ca)MnO$_3$), strontium-titanium oxide, barium-strontium-titanium oxide, strontium-zirconium oxide, barium-zirconium oxide and barium-strontium-zirconium oxide. Ends of the filament may be connected to the bottom surface and the top surface of the data storage element DSE", respectively. The data storage element DSE" with the filament may have a lower resistivity than the data storage element DSE" without the filament and/or in which the filament is broken. The data storage element DSE" can store multi-bit data according to the number of the filaments which are generated in the data storage element DSE".

The data storage element DSE" may be formed of phase changeable material in still further embodiments. The resistivity of the phase changeable material may be changed according to the phase of the lattice structure. For example, a phase changeable material in a crystalline state may have a lower resistivity than a phase changeable material in amorphous state. The phase changeable material may include at least one of tellurium, selenium, and other chalcogenide elements. For example, the phase changeable material may include at least one of Ge—Sb—Te (germanium-antimony-tellurium), As—Sb—Te (arsenic-antimony-tellurium), As—Ge—Sb—Te (arsenic-germanium-antimony-tellurium), Sn—Sb—Te (tin-antimony-tellurium), Ag—In—Sb—Te (argentum-indium-antimony-tellurium), In—Sb—Te (indium-antimony-tellurium), 5A group element-antimony-tellurium, 6A group element-antimony-tellurium, 5a group element-antimony-selenium, 6A group element-antimony-selenium, germanium-antimony, indium-antimony, gadolinium-antimony and doped germanium-antimony-tellurium. The doped germanium-antimony-tellurium may be doped with carbon, nitrogen, barium, bismuth, silicon, phosphorous, aluminum, dysprosium, and/or titanium.

As described above, the data storage element DSE connected to the top surface of the channel pillar 126 may be, but is not limited to, a capacitor or a variable resistivity element. In one embodiment, the data storage element DSE may be a vertical cell string in which a plurality of memory cell is connected in series. For example, the data storage element DSE may include a vertical channel element, a plurality of data lines sequentially stacked and crossing over the sidewall of the vertical channel element, and a data storage layer disposed between the vertical channel element and the data lines.

The recessed region 112 and the low resistivity conductive pattern 116 may also be formed into other shapes.

Figure 4:
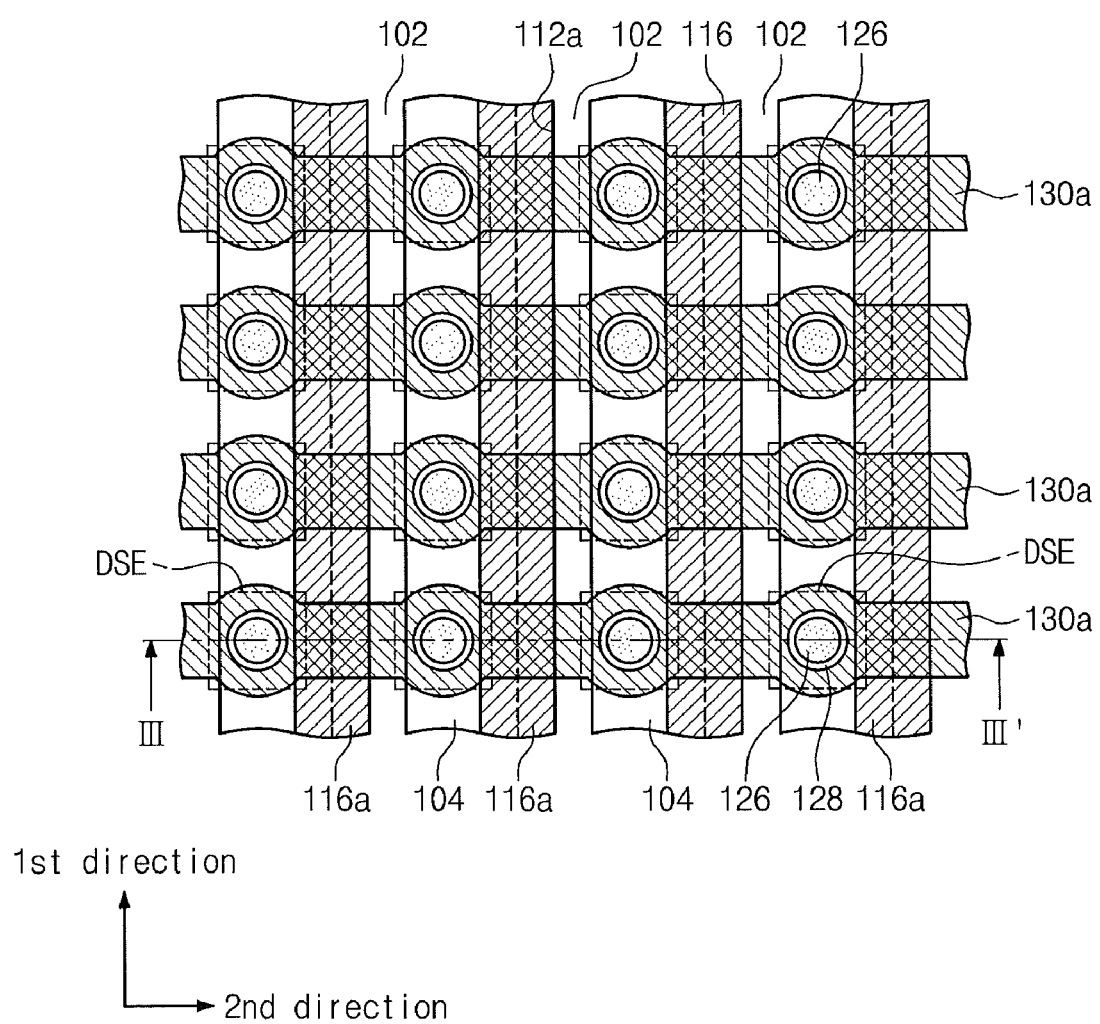
FIG. 4 is a top plan view illustrating other types of recessed regions and low resistivity conductive patterns of a semiconductor device according to further embodiments of the inventive concept.
Figure 5A:
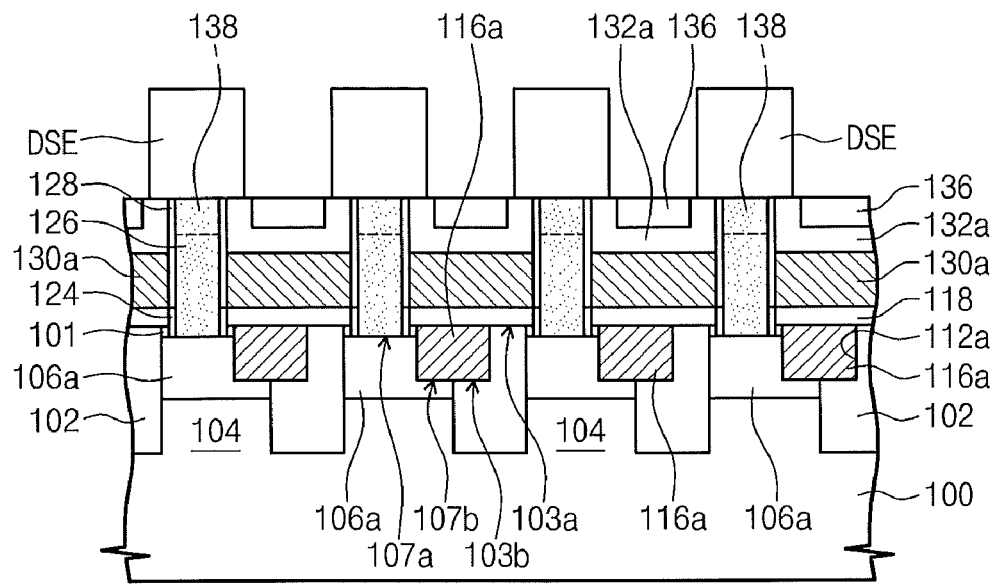
FIG. 5A is a cross-sectional view taken along line of FIG. 4.
Figure 5B:
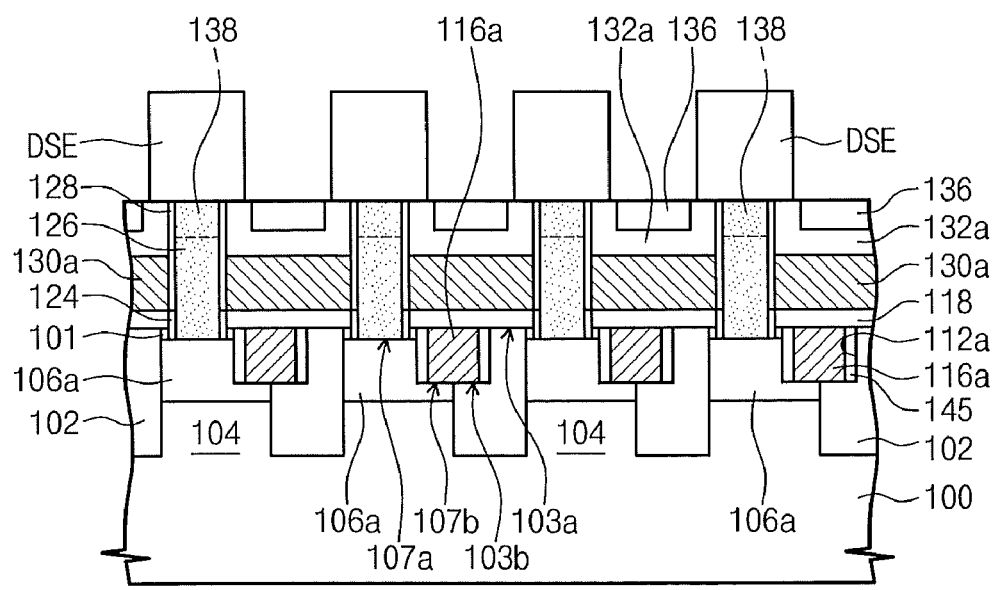
FIG. 5B is a cross-sectional view taken along line of FIG. 4, illustrating a modified embodiment of FIG. 4.

FIG. 4 is a top plan view illustrating further embodiments of recessed regions and low resistivity conductive patterns of a semiconductor device according to some embodiments of the inventive concept, FIG. 5B is a cross-sectional view taken along line III-III' of FIG. 4, and FIG. 5B is a cross-sectional view taken along line of FIG. 4, illustrating a modified embodiment of FIG. 4.

Referring to FIGS. 4 and 5A, a recessed region 112a may be formed in the active area 104 as well as the device isolation pattern 102. Thus, the recessed region 112a may be formed in the device isolation pattern 102 and extended into the active area 104 laterally. The active area 104 may have a recessed surface 107b lower than a top surface 107a of the active area 104. The top surface 107a and the recessed surface 107b of the active area 104 may be substantially in parallel. A bottom surface of the recessed region 112a may further include the recessed surface 107b of the active area 104. Thus, the bottom surface of the recessed region 112a may include the recessed surface 107b of the active area 104 and the recessed surface 103b of the device isolation pattern 102. The recessed surface 107b of the active area 104 may be substantially planar with the recessed surface 103b of the device isolation pattern. The recessed region 112a may include a first inner sidewall and a second inner sidewall. The first inner sidewall of the recessed region 112a may include a sidewall of the device isolation pattern 102 which connects the top surface 103a and the recessed surface 103b of the device isolation pattern 102. The second inner sidewall of the recessed region 112a may include a sidewall of the active area 104 which connects the top surface 107a and the recessed surface 107b of the active area 104.

A low resistivity conductive pattern 116a is disposed in the recessed region 112a in contact with a doped region 106a. The lower boundary of the doped region 106a may be lower than the bottom surface of the recessed region 112a. The doped region 106a may be formed beneath a surface which includes the top surface 107a, the recessed surface 107b and the sidewall connecting the top surface 107a and the recessed surface 107b of the active area 104. The low resistivity conductive pattern 116a may fill a part of the recessed region 112a or the entire recessed region 112a. The low resistivity conductive pattern 116a may be in contact with the recessed surface 107b, and the sidewall of the active area 104, such that the low resistivity conductive pattern 116a is in contact with the doped region 106a. Thereby, the contact surface between the low resistivity conductive pattern and the doped region 106a can be enlarged.

The recessed region 112a, the doped region 106a, and the low resistivity conductive pattern 116a may be in contact with each other while extending in parallel along the first direction of FIG. 1. The contact surface between the doped region 106a and the low resistivity conductive pattern 116a may extend in the first direction of FIG. 1. The doped region 106a may be doped with the same dopant as the doped region 106 of FIGS. 2A and 2B. The low resistivity conductive pattern 116a may include a conductive material which has a lower resistivity than the doped region 106a. For example, the low resistivity conductive pattern 116a may be formed of the same material with as low resistivity conductive pattern 116 of FIGS. 1, 2A and 2B.

Referring to FIG. 5B, in one embodiment, sidewall spacers 145 may be provided in the recessed region 112a. One of the sidewall spacers 145 may be interposed between the low resistivity conductive pattern 116a and the first inner sidewall of the recessed region 112a, and another of the sidewall spacers 145 may be interposed between the low resistivity conductive pattern 116a and the second inner sidewall of the recessed region 112a. As shown in FIG. 5B, the first inner sidewall of the recessed region 112a may include the sidewall which connects the top surface 103a and the recessed surface 103b of the device isolation pattern 102. The second inner wall of the recessed region 112a may include the sidewall which connects the top surface 107a and the recessed surface 107b of the active area 104. The low resistivity conductive pattern 116a may be in contact with the recessed surface 107b of the active area 104 and the recessed surface 103b of the device isolation pattern 102. Thereby, the low resistivity conductive pattern 116a may be in contact with the doped region 106a at the sidewall of the active area 104. The sidewall spacer 145 may include insulating material. For example, the sidewall spacer 145 may include oxide, nitride and/or oxy-nitride. The distance between the low resistivity conductive pattern 116a and a neighboring doped region 106a in a neighboring active area 104 can be enlarged by the sidewall spacer 145. Thus, the isolation between the doped regions 106a can be improved.

The data storage element DSE of FIGS. 4, 5A and 5B may be replaced by the data storage element DSE' of FIG. 3A or the data storage element DSE" of FIG. 3B in some other embodiments.

Figure 6:
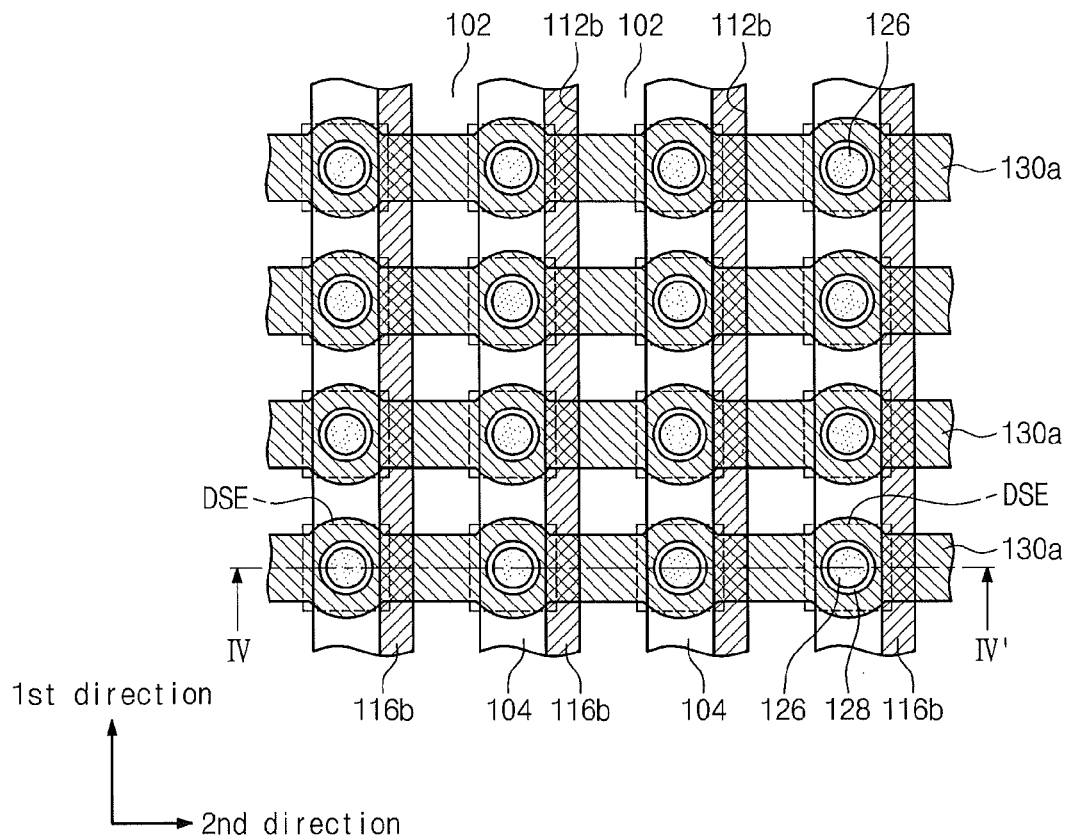
FIG. 6 is a top plan view illustrating a semiconductor device according to embodiments of the inventive concept where the recessed regions and the low resistivity conductive patterns are formed in still other types.
Figure 7:
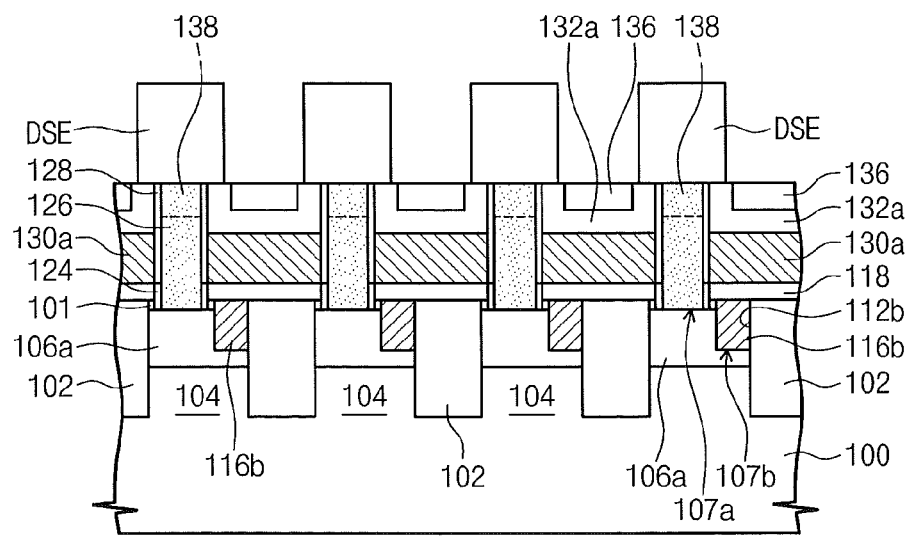
FIG. 7 is a cross-sectional view taken along line IV-IV' of FIG. 6.

FIG. 6 is a top plan view illustrating a semiconductor device according to embodiments of the inventive concept where the recessed regions and the low resistivity conductive patterns are formed in still other types, and FIG. 7 is a cross-sectional view taken along line IV-IV' of FIG. 6.

Referring to FIGS. 6 and 7, a low resistivity conductive pattern 116b may be disposed in a recessed region 112b in the active area 104. The active area 104 may include a top surface 107a and a recessed surface 107b lower than the top surface 107a. The recessed surface 107b of the active area 104 may be a bottom surface of the recessed region 112b. The bottom surface of the recessed region 112b may be higher than the lower boundary of the doped region 106a. The recessed region 112b may include a first inner sidewall and a second inner sidewall. The first inner sidewall of the recessed region 112b may include a sidewall which connects the top surface 107a and the recessed surface 107b of the active area 104 and which is formed of a part of the active area 104. The second inner sidewall of the recessed region 112b may include a part of a sidewall of the device isolation pattern 102, which is adjacent to the recessed region 112b. The device isolation pattern 102 may not include a recessed surface.

The low resistivity conductive pattern 116b may fill a part of the recessed region 112b or the entire recessed region 112b to be in contact with the doped region 106a. The low resistivity conductive pattern 116b and the doped region 106a may extend in parallel along the first direction to be in contact with each other. The low resistivity conductive pattern 116b may include conductive material which has a lower resistivity than the doped region 106a. For example, the low resistivity conductive pattern 116b may be formed of the same material as the low resistivity conductive pattern 116 of FIGS. 2A and 2B.

The data storage element DSE of FIGS. 6 and 7 may be replaced by the data storage element DSE' of FIG. 3A or the data storage element DSE" of FIG. 3B in some embodiments.

FIGS. 8A through 8J are cross-sectional views taken along line I-I' of FIG. 1, illustrating methods of fabricating a semiconductor device according to some embodiments of the present inventive concept.

Figure 8A:
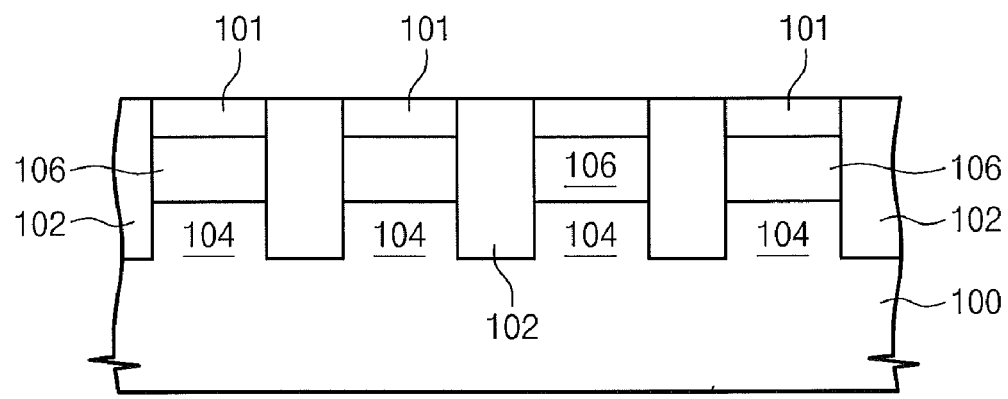
FIGS. 8A through 8J are cross-sectional views taken along line I-I' of FIG. 1, illustrating a method of fabricating a semiconductor device according to some embodiments of the inventive concept.

Referring to FIG. 8A, hard mask patterns 101 may be formed on a semiconductor substrate 100 to define active areas 104. The hard mask patterns 101 may extend in parallel along the first direction of FIG. 1. The hard mask patterns 101 may be spaced apart each other along the second direction of FIG. 2. The hard mask patterns 101 may be formed of insulating material which has an etch selectivity to the semiconductor substrate. For example, the hard mask pattern may be formed of oxide, nitride and/or oxy-nitride.

The semiconductor substrate 100 may be etched using the hard mask pattern 101 as an etch mask to form a trench, which defines active areas 104. The active areas 104 are doped with dopants of a first conductivity type. A device isolation pattern 102 may be formed to fill the trench. Specifically, a sidewall thermal oxide may be formed on the sidewall and the bottom of the trench by a thermal oxidation process. A liner may be formed on the thermal oxide. A filling oxide may be formed on the liner to fill the trench. At least the filling oxide may be planarized to form the device isolation pattern 102. Portions of the liner on the hard mask pattern 101 may be removed in the planarization process. The device isolation pattern 102 may include the thermal oxide, the liner and the buried oxide in the trench.

A doped region 106 may be formed in the active area 104. The doped region 106 may be formed after defining the active areas 104. For example, dopants of a second conductivity type may be injected into the active areas 104 by an ion implantation to form the doped regions 106 after forming the device isolation pattern 102.

Alternatively, the semiconductor substrate 100 may include a region where the vertical transistors of FIGS. 1, 2A and 2B are formed in some embodiments. A preliminary doped region may be formed by injecting dopants of the second conductivity type into the entire region where the vertical transistors are formed. And then, the hard mask patterns 101 and the device isolation pattern 102 may be formed after forming the preliminary doped region. According to this method, the active area 104 and the doped region 106 may be simultaneously defined by the formation of the device isolation pattern 102.

Figure 8B:
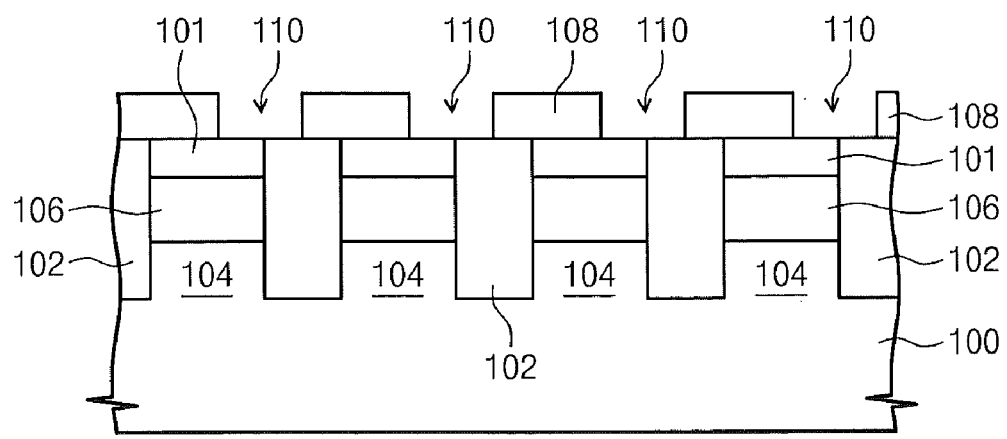

Referring to FIG. 8B, a mask pattern 108 may be formed on the semiconductor substrate 100 having the device isolation pattern 102. The mask pattern 108 has openings 110. The openings 110 may be disposed over a part of the device isolation pattern 102 and a part of active area 104 adjacent to the device isolation pattern 102. Each of the openings 110 may expose a part of the device isolation pattern 102 and a part of the hard mask pattern 101 on the active area 104. The openings 102 may extend in the first direction of FIG. 1. The openings 102 may be parallel with each other. The openings 102 may be spaced apart from each other along the second direction of FIG. 1. The mask pattern 108 may have an etch selectivity with respect to the device isolation pattern 102. The mask pattern 108 may also have an etch selectivity to the active area 104. In addition, the mask pattern 108 may have an etch selectivity to the hard mask pattern 101. For example, the mask pattern 108 may be formed of a photoresist.

Figure 8C:
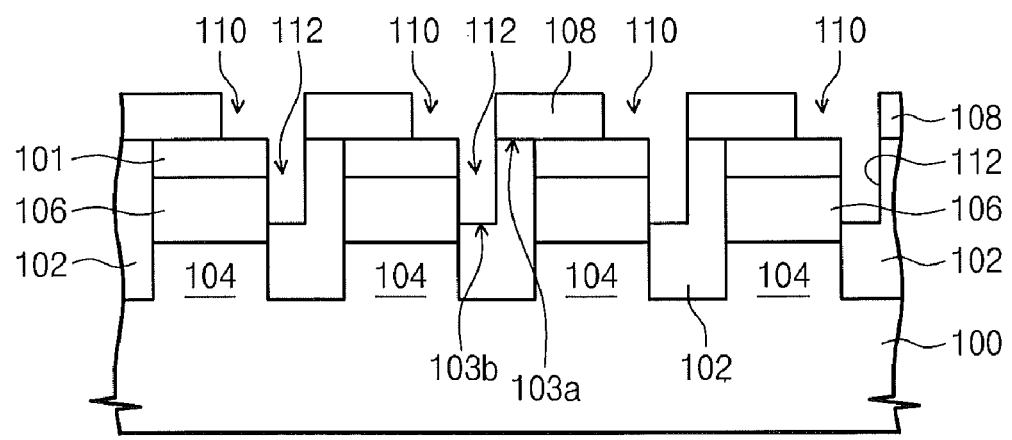

Referring to FIG. 8C, the portion of the device isolation pattern 102 that is exposed by the opening 110 may be etched using the mask pattern 108 as an etch mask to form a recessed region 112 in the device isolation pattern 102. In this etching process, a recessed surface 103b lower than a top surface 103a of the device isolation pattern 102 may be formed in the device isolation pattern 102. The recessed surface 103b of the device isolation pattern 102 may correspond to a bottom surface of the recessed region 112. The active area 104 is exposed on and defines a sidewall of the recessed region 112.

The hard mask pattern 101 exposed in the opening 110 may be used as an etch mask in the etching process. Thus, the device isolation pattern 102 may be etched without substantially etching remaining the active area 104 exposed by the opening 110. Etch rates of the hard mask pattern 101 and/or the active area 104 by the etch process may be lower than a etch rate of the device isolation pattern 102 by the etch process.

Figure 8D:
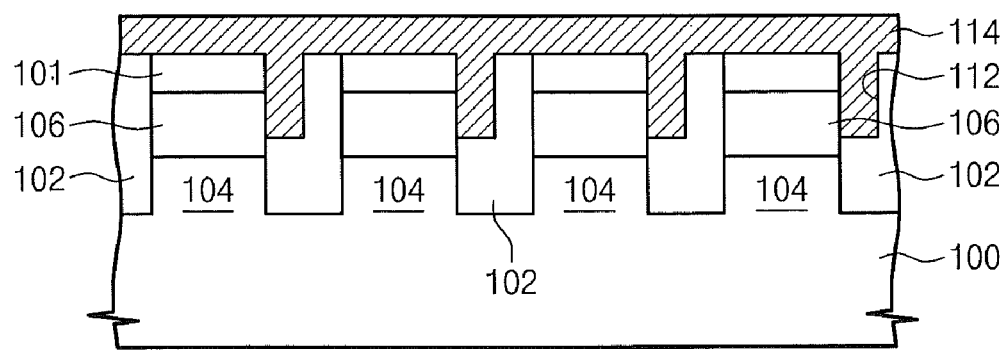

Referring to FIG. 8D, next, the mask pattern 108 may be removed. A low resistivity conductive layer 114 may be formed on the entire surface of the semiconductor substrate 100 to fill the recessed region 112. The low resistivity conductive layer 114 may be formed by a chemical vapor deposition process, an atomic layer deposition process, and/or a metal-semiconductor reaction process. The metal-semiconductor reaction process may be include depositing a metal layer being in contact with the active area 104 exposed in the recessed region 112, and reacting the metal layer and the active area 104 to form a metal-semiconductor compound. After forming the metal-semiconductor compound, remaining metal layer may be removed. In one embodiment, a buffer semiconductor may be formed in the recessed region 112 by an epitaxial process using the active area 104 exposed in the recessed region 112 as a seed layer, before the metal-semiconductor reaction process. In this case, the metal layer in the metal-semiconductor reaction process may be in contact with the buffer semiconductor and reacted with the buffer semiconductor to form the metal-semiconductor compound. For example, the metal-semiconductor reaction process may be a metal silicidation process.

Figure 8E:
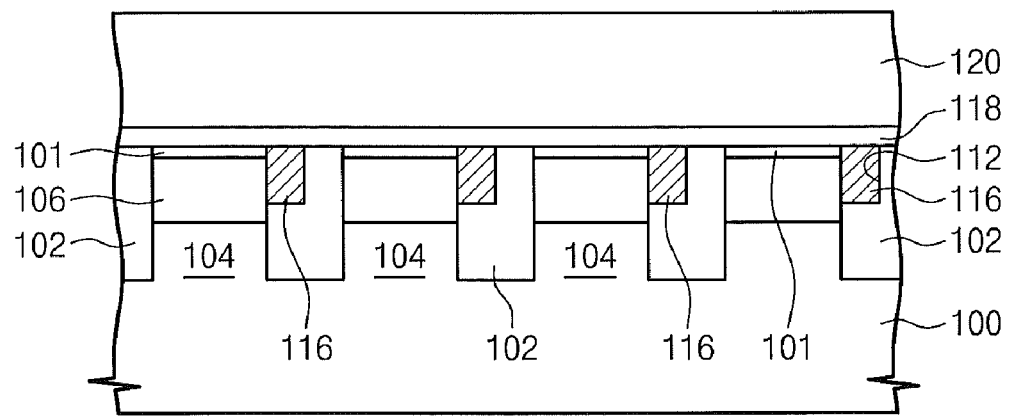

Referring to FIG. 8E, the low resistivity conductive layer 114 may be planarized to expose the device isolation pattern 102 and the hard mask pattern 101 to form a low resistivity conductive pattern 116 in the recessed region 112. A part of the hard mask pattern 101 and a part of the device isolation pattern 102 may also be planarized in the planarization process. As such, top or upper surfaces of the low resistivity conductive pattern 116, the device isolation pattern 102, and the hard mask pattern 101 may be substantially coplanar due to the planarization process.

Subsequently, an insulating layer 118 and a mold layer 120 may be formed sequentially on the semiconductor substrate 100. The insulating layer 118 may include insulating material with etch electivity with respect to the mold layer 120. For example, the mold layer 120 may be formed of a oxide layer and the insulating layer 118 may be formed of a nitride layer and/or an oxy-nitride layer.

Figure 8F:
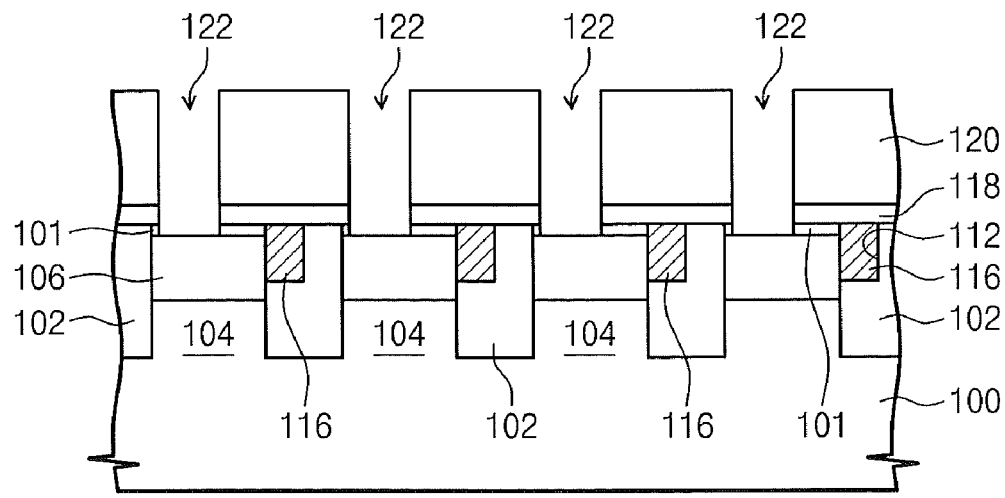

Referring to FIG. 8F, the mold layer 120, the insulating layer 118 and the hard mask pattern 101 are sequentially patterned to form holes 122 exposing top surfaces of the active areas 104. A plurality of holes 122 may be formed over the semiconductor substrate 100. The height of such hole 122 may be controlled by adjusting the thickness of the mold layer 120.

Figure 8G:
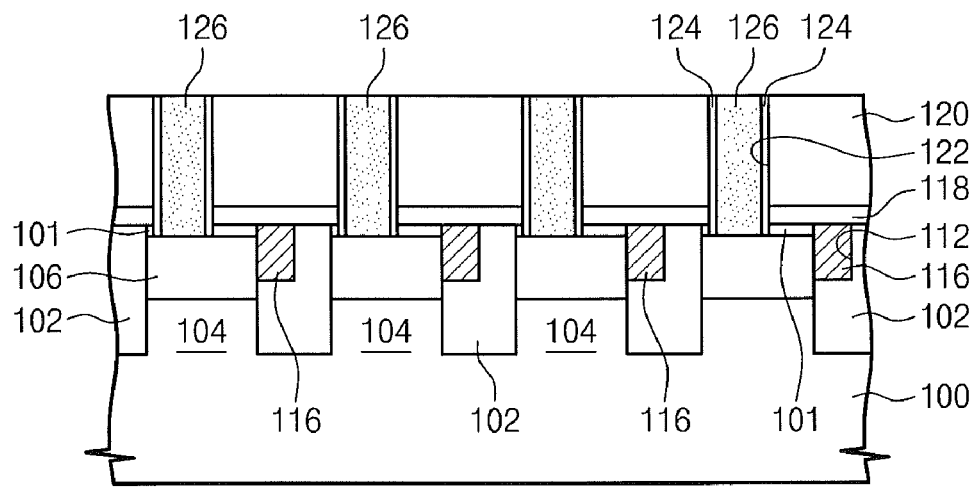
Figure 8H:
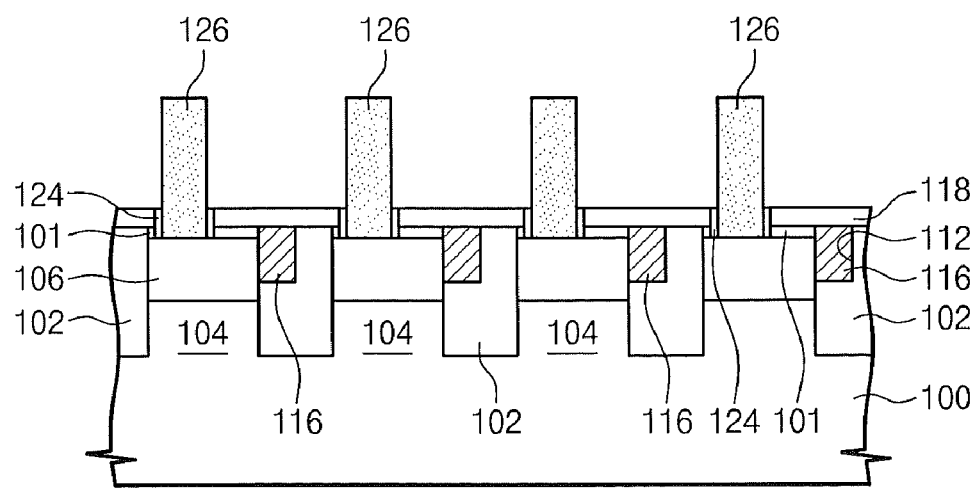

Referring to FIG. 8G, a hole spacer 124 may be formed on sidewalls of the holes 122. The hole spacer 124 may be formed of oxide, nitride and/or oxy-nitride. A channel pillar 126 is formed filling each of the holes 122. The hole spacer 124 may be formed to improve the alignment margin between each channel pillar 126 and the top surface of the active area 104 therebelow. Alternatively, the hole spacer 124 may be omitted in some embodiments. The channel pillars 126 may be formed of semiconductor material. The channel pillars 126 may be formed of the same semiconductor material as the active area 104. Each of the channel pillars 126 may be in contact with an active area 104 which is exposed by the corresponding hole 122. The active area 104 may affect the channel pillar 126 to be formed in single-crystalline state. The channel pillars 126 may be formed using the corresponding active areas 104 exposed by the respective holes 122 as a seed layer in a selective epitaxial growth process.

Alternatively, an amorphous or a poly crystalline semiconductor layer may be formed to be in contact with each of the active areas 104 exposed by the holes 122 and a thermal treatment process may be then conducted to form the channel pillars 126. The semiconductor layer may be formed using a chemical vapor deposition process or an atomic layer deposition process. In the thermal treatment process, the semiconductor layer may be formed in a single crystalline state by using the active area 104 as a seed layer. The thermal treatment may include rapid thermal processing and/or a laser thermal processing. Portions of the semiconductor layer extending out of the hole 122 may be planarized. That is, the semiconductor layer may be planarized after the thermal treatment process. Alternatively, the thermal treatment process may be performed after planarizing the semiconductor layer in some embodiments.

Referring to 8H, after forming the channel pillars 126, the mold layer 120 and the hole spacers 124 may be removed to expose sidewalls of the channel pillar 126. The mold layer 120 may be removed using an isotropic etching process such as wet etching. Since the insulating layer 118 has an etch selectivity with respect to the mold layer 120, the insulating layer 118 protects a structure under the insulating layer 118 from the etching process used to remove the mold layer 120. The hole spacers 124 may also be etched using an isotropic etching process such as wet etching. A part of the hole spacer 124 may remain between the insulating layer 118 and the channel pillar 126.

Next, a gate electrode surrounding the channel pillar 126, and a gate dielectric layer disposed between the gate electrode and the channel pillar 126 are formed. The formation of the gate electrode and the gate dielectric layer will be explained referring FIGS. 8I, 8J, 9A and 9B.

Figure 8I:
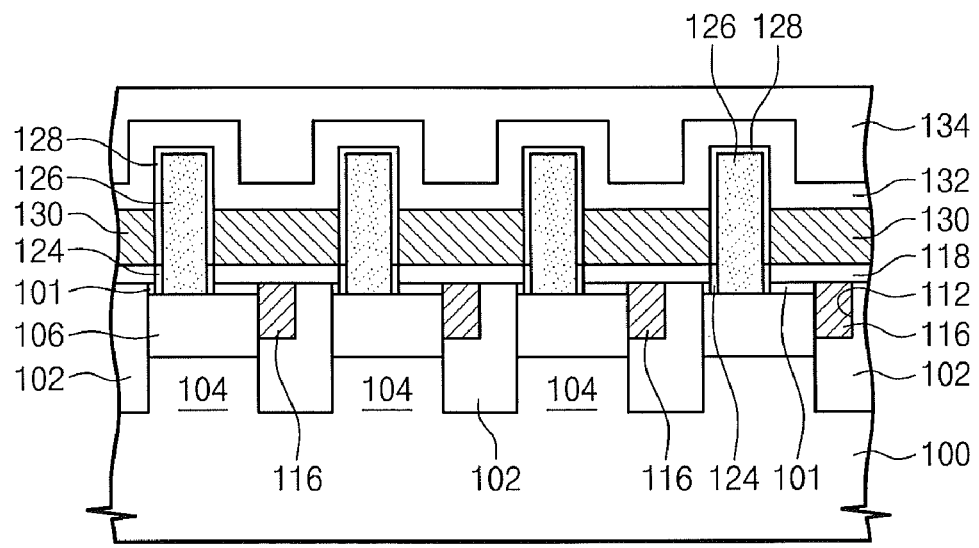
Figure 8J:
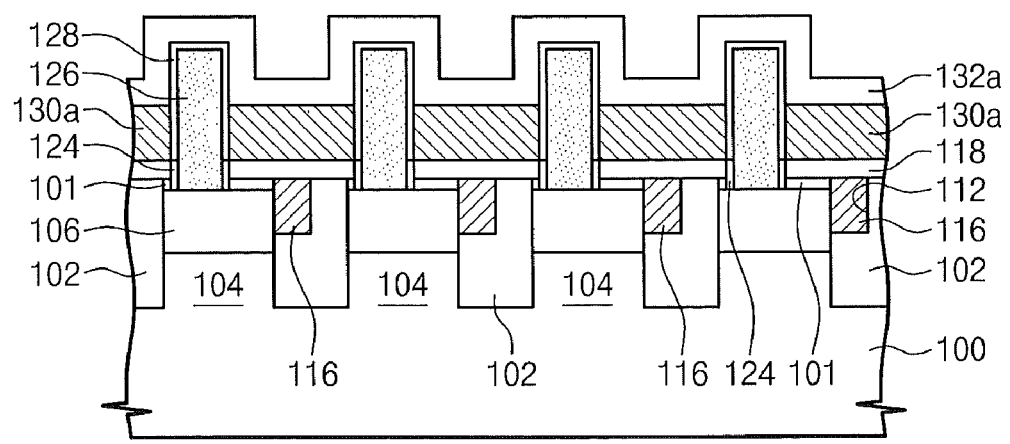
Figure 9A:
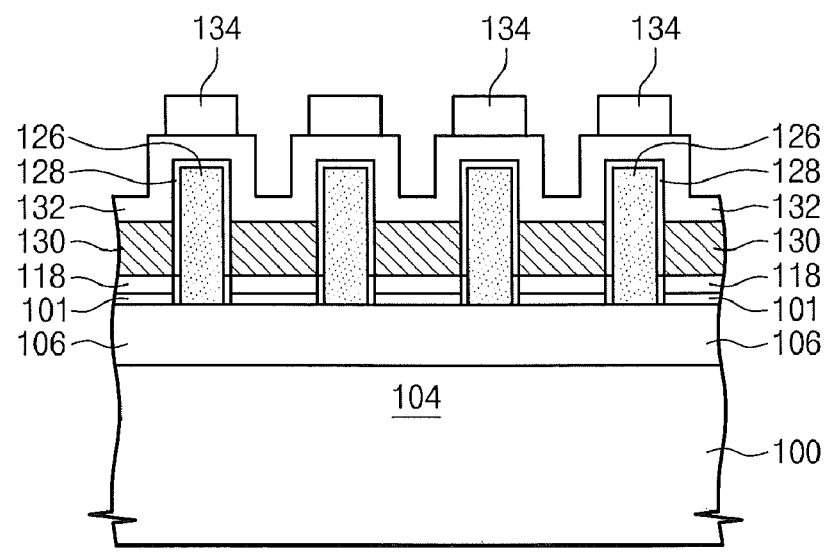
FIGS. 9A and 9B are cross-sectional views taken along line II-II' of FIG. 1, illustrating a method of fabricating a semiconductor device according to some embodiments of the inventive concept.
Figure 9B:
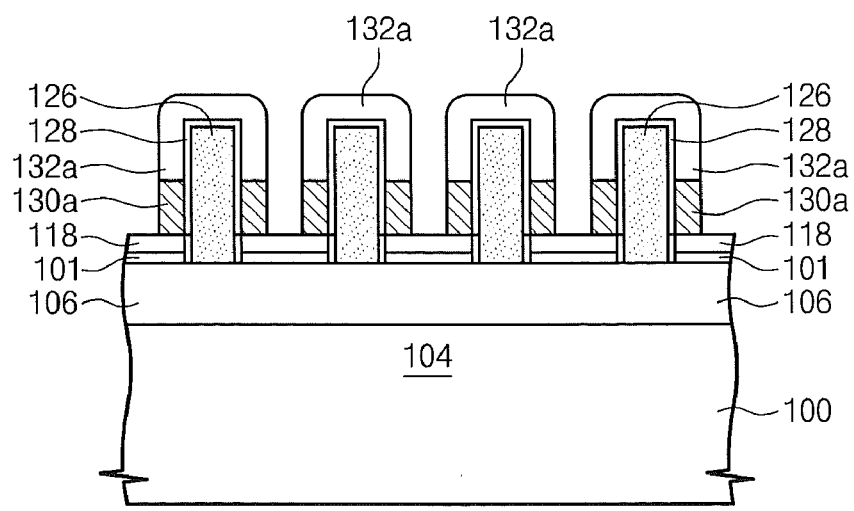

FIGS. 9A and 9B are cross-sectional views taken along line II-II' of FIG. 1, illustrating methods of fabricating semiconductor devices according to some embodiments of the present invention. FIGS. 8I and 9A are views respectively taken along lines I-I' and II-II' of FIG. 1, after forming a gate mask pattern 134, and FIGS. 8J and 9B are views respectively taken along line I-I and II-II' of FIG. 1, after forming a gate electrode 130a.

Referring to FIGS. 8I and 9A, the gate dielectric layer 128 may be formed on the exposed surface of the channel pillar 126. The gate dielectric layer 128 may be formed in a thermal oxidation process, a thermal oxy-nitridation process and/or a nitridation process. The gate dielectric layer 128 may be formed on the exposed sidewalls and the top surfaces of the channel pillars 126.

A gate conductive layer is formed on the semiconductor substrate having the gate dielectric layer 128. The gate conductive layer may be formed in spaces between the channel pillars 126. The gate conductive layer may be planarized using the gate dielectric layer on the top surfaces of the channel pillars 126 as an etch stop layer. Subsequently, a top surface of the planarized gate conductive layer may be recessed to be lower than the top surfaces of the channel pillars 126. Thereby, the channel pillars 126 provide respective protrusions that are higher than the top surface of the gate conductive layer 130.

A capping insulating layer 132 may be formed conformally on the semiconductor substrate 100 having the recessed gate conductive layer 130. The capping insulating layer 132 covers the sidewalls and the top surfaces of the protrusions of the channel pillars 126. A gate mask pattern 134 for defining a gate electrode is formed on the capping layer 132. A plurality of gate mask patterns 134 may extend in the second direction of FIG. 1. The gate mask patterns 134 may have a substantially uniform width.

The capping insulating layer 132 may include a first part and a second part. The first part of the capping insulating layer 132 may surround sidewalls and top surfaces of the protrusions of the channel pillars 126. The second part of the capping insulating layer 132 may be disposed on the recessed gate conductive layer 130 between the channel pillars 126. The second part of the capping insulating layer 132 may have a top surface lower than a top surface of the first part. The gate mask pattern 134 may also have a first part and a second part. The first part of the gate mask pattern 134 may be disposed on the first part of the capping insulating layer 132, and the second part of the gate mask pattern 134 may be disposed on the second part of the capping insulating layer 132. The first part of the gate mask pattern 134 and the second part of the gate mask pattern may have the same width. The width of the first part of the gate mask pattern 134 may be narrower than that of the capping insulating layer 132 in the first direction of FIG. 1. Thereby, a portion of first part of the gate mask pattern 134 located at both sides of the first part of the gate mask pattern 134 may be exposed. The gate mask pattern 134 may be formed with an etch selectivity with respect to the capping insulating layer 132 and the gate conductive layer 130. For example, the gate mask pattern 134 may be formed of photoresist.

Referring to FIGS. 8J and 9B, the capping insulating layer 132 and the gate conductive layer 130 are successively etched using the gate mask pattern 134 as an etch mask to form a gate electrode 130a and a capping insulating pattern 132a which are sequentially stacked. The capping insulating pattern 132a has a first part and a second part. The first and the second part of the capping insulating pattern 132a may be formed from the first and the second part of the capping insulating layer 132, respectively.

The first part of the capping insulating layer 132 may have a first thickness in the vertical direction to the top surface of the semiconductor substrate 101. The second part of the capping insulating layer 132 may have a second thickness in the vertical direction. The first thickness may be more than the second thickness. The exposed first part of the capping insulating layer 132 may be etched to be a spacer shape, such that the first part of the capping insulating pattern 132a may be an etch mask for the gate conductive layer 130. Therefore, as shown in FIG. 1, the first part of the gate electrode 130a which is disposed under the first part of the capping insulating pattern 132a may be wider than the second part of the gate electrode 130a which is disposed under the second part of the capping insulating pattern 132a. A portion of the capping insulating pattern 132a under the gate mask pattern 134 may cover the top surfaces of the channel pillars 126.

Subsequently, the gate mask pattern 134 may be removed and an interlayer dielectric layer may be formed on the entire surface of the semiconductor substrate 100. The interlayer dielectric layer may be planarized until the capping insulating pattern 132a on the top surface of the channel pillar 126 is exposed, thereby forming the interlayer dielectric layer 136 as shown in FIGS. 2A and 2B. The exposed capping insulating pattern 132a may be removed to expose the gate dielectric layer 128 on the top surfaces of the channel pillars 126. The exposed gate dielectric layer 128 may be removed to expose the top surfaces of the channel pillars 126. If the gate dielectric layer 128 and the capping insulating pattern 132a on the channel pillars 126 are removed in a selective etching process such as wet etching, the top surface of the planarized interlayer dielectric layer 136 may be higher than the top surfaces of the channel pillars 126. Alternatively, the interlayer dielectric layer 136, the capping insulating pattern 132a and the gate dielectric layer 128 may be sequentially planarized in a chemical mechanical polishing (CMP) process. In this case, as shown in FIGS. 2A and 2B, the top surface of the planarized interlayer dielectric layer 136, the top surfaces of the channel pillars 126, and the top surface of the capping insulating pattern 132a surrounding the protrusion of the channel pillar 126 may be coplanar with each other.

Dopants of a second conductivity type may be injected into the upper parts of the channel pillars 126 to form the source/drain regions 138 of FIGS. 2B and 2B. The source/drain regions 138 may be formed after removing the capping insulating pattern 132a on the top surfaces of the channel pillars 126. Alternatively, the source/drain 138 may be formed between the forming of the channel pillars 126 in the holes 122 of FIG. 8G and the removing of the mold layer 120.

Data storage elements DSE are formed to be in contact with the top surfaces of the channel pillars 126, thereby producing the semiconductor device of FIGS. 1, 2A and 2B.

A method of fabricating the data storage elements DSE' of FIG. 3A will now be described with reference to FIG. 3A.

Referring to FIG. 3A, an etch stop layer 149 and a capacitor mold layer may be formed on the semiconductor substrate, after removing the capping insulating pattern 132a and the gate dielectric layer 128 on the top surface of the channel pillar 126. The capacitor mold layer and the etch stop layer 149 may be sequentially patterned to form a capacitor hole which exposes the top surface of the channel pillar 126. A lower electrode 150 may be formed in the capacitor hole. Subsequently, the capacitor mold layer may be removed to expose the surface of the lower electrode 150. A capacitor dielectric layer 152 and an upper electrode 154 may be sequentially formed, thereby forming the data storage elements DSE' of FIG. 3A.

A method of fabricating the data storage elements DSE" of FIG. 3B will now be described with reference to FIG. 3B.

Referring to FIG. 3B, a variable resistivity layer and a capping electrode layer are sequentially formed on the semiconductor substrate 100 including the exposed top surfaces of the channel pillars 126. The capping electrode layer and the variable resistor layer are successively patterned to form a data storage elements DSE" and capping electrodes 160 which are sequentially stacked on the top surfaces of the channel pillars 126. Subsequently, an upper interlayer dielectric layer 162 is formed. A contact plug 164 is formed, which is in contact with the capping electrode through the upper dielectric layer 162. An interconnection line 166 is formed, thereby a producing a semiconductor device having data storage elements DSE" provided by variable-resistivity elements.

A method for fabricating the semiconductor devices of FIGS. 4 and 5A will now be described. This method includes fabrication methods which are described with reference to FIGS. 8A and 8B.

Figure 10:
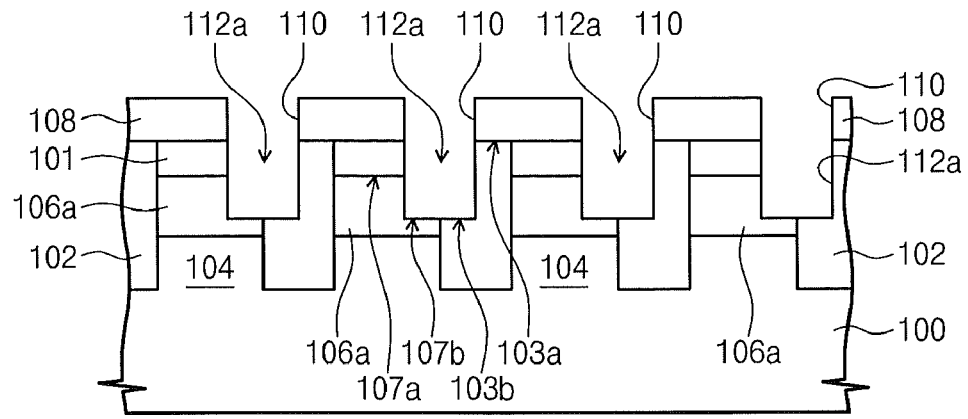
FIG. 10 is a cross-sectional view taken along line of FIG. 4, illustrating a method of fabricating the semiconductor device of FIG. 4.

FIG. 10 is a cross-sectional view taken along line III-III' of FIG. 4, illustrating a method of fabricating the semiconductor device of FIG. 4 according to some embodiments.

Referring to FIGS. 8B and 10, active areas 104 and device isolation patterns 102, which overlap with openings 110, may be etched using a mask pattern 108 as an etch mask to form recessed regions 112a. In the etching process, hard mask patterns 101 which are exposed in the openings 110 may be etched. An etch rate of the active areas 104 by the etching process may be substantially identical with an etch rate of the device isolation pattern 102 by the etching process. Additionally, the etch rate of the active area 104 by the etching process may be substantially identical with an etch rate of the hard mask patterns 101 by the etching process. Subsequent processes may be the same as or similar to the processes which are described with reference to FIGS. 8D through 8J, 9A and 9B. The data storage elements DSE, DSE' or DSE" may be formed. As a result, the semiconductor device of FIG. 5B may be fabricated.

A method of fabricating the semiconductor devices of FIGS. 6 and 7 will now be described. This method may include fabrication methods which are described with reference to FIGS. 8A and 8B.

Figure 11:
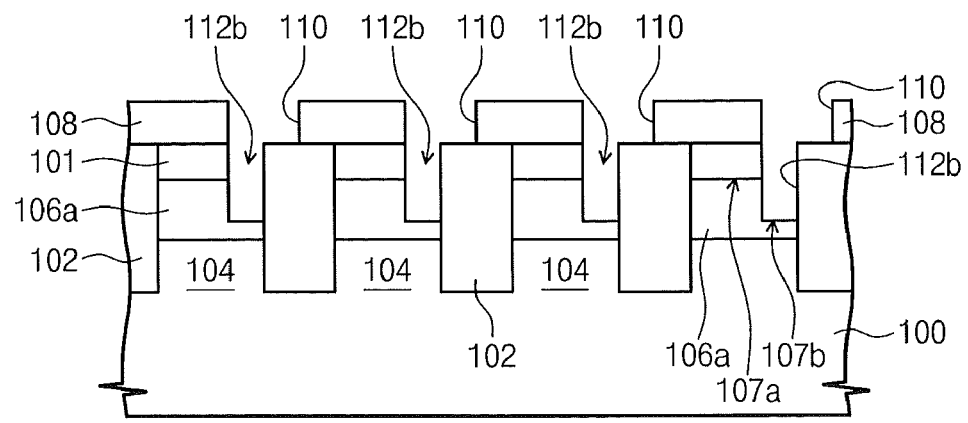
FIG. 11 is a cross-sectional view taken along line IV-IV' of FIG. 6, illustrating a method of fabricating the semiconductor device of FIG. 6.

FIG. 11 is a cross-sectional view taken along line IV-IV' of FIG. 6, illustrating a method of fabricating the semiconductor device of FIG. 6.

Referring to FIGS. 8B and 11, the active areas 104 which overlap with the openings 110 are etched using the mask pattern 108 as an etch mask to form recessed regions 112b. The device isolation patterns 102 may be used as the etch mask. The hard mask patterns 101 exposed by the openings 110 and the active areas 104 may be successively etched by an etching process to form the recessed regions 112b. In the etching process, the etch rate of the active areas 104 may be higher than that of the device isolation patterns 102 and the etch rate of the hard mask patterns 101 may be higher than that of the device isolation patterns 102. In the etching process, the etch rate of the hard mask patterns 101 may be substantially identical or different than that of the active areas 104. Subsequent processes may be the same as or similar to the processes which are described with reference to FIGS. 8C through 8J, 9A and 9B. The data storage elements DSE, DSE' or DSE" may be formed. As a result, the semiconductor devices of FIGS. 6 and 7 can be fabricated.

Embodiment 2

Figure 12:
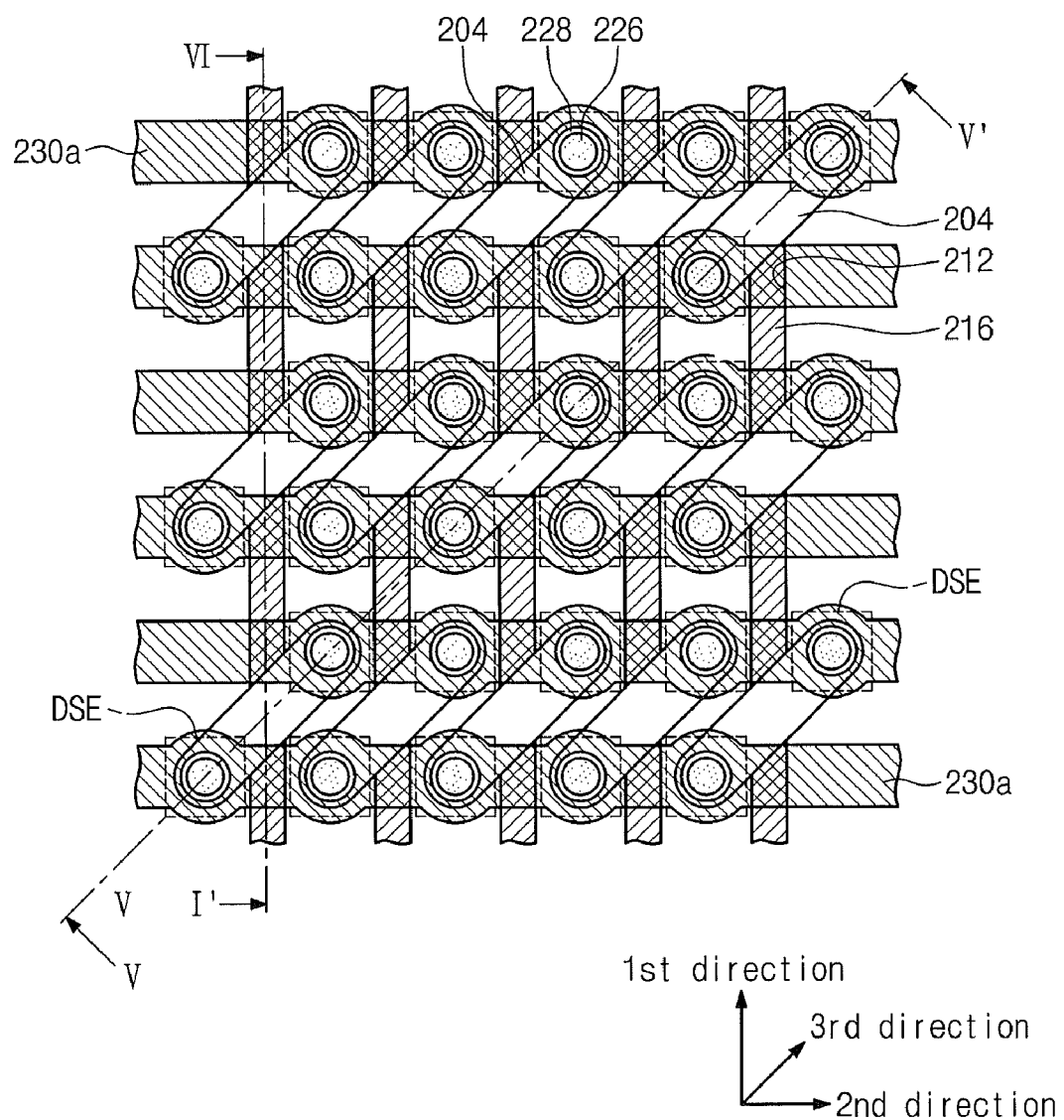
FIG. 12 is a top plan view illustrating other embodiments of the inventive concept.
Figure 13A:
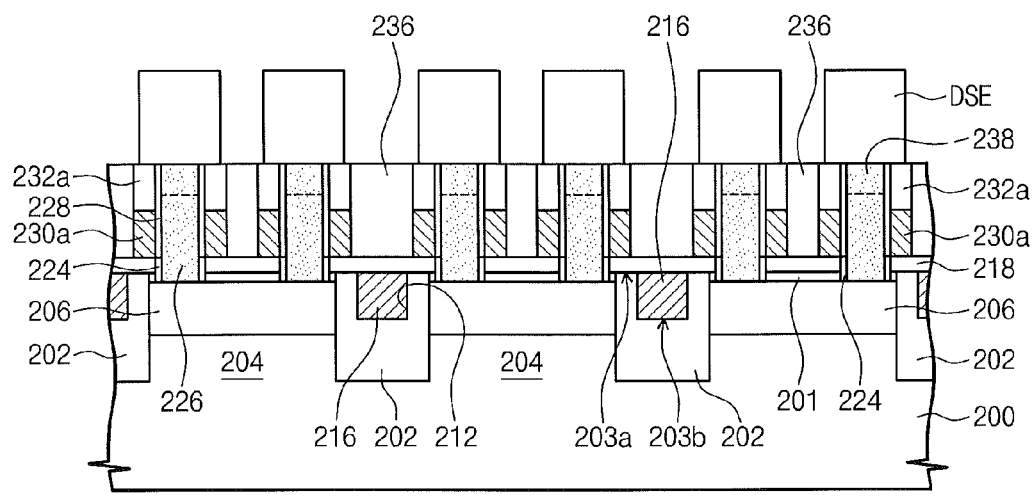
FIG. 13A is a cross-sectional view taken along line V-V' of FIG. 12.
Figure 13B:
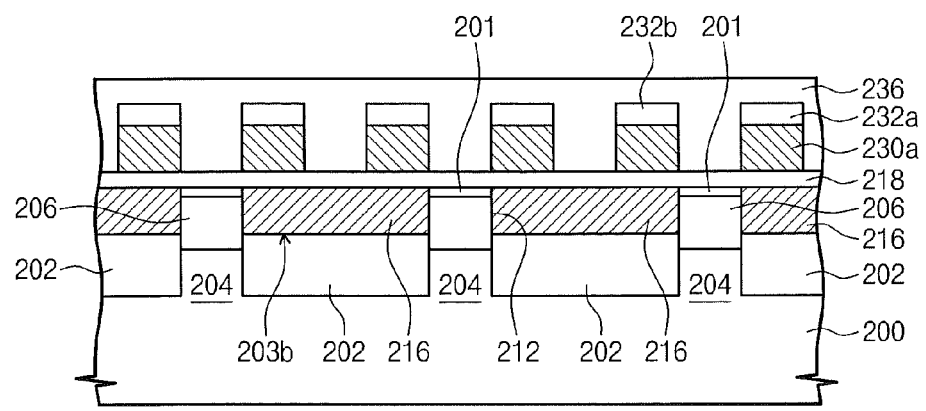
FIG. 13B is a cross-sectional view taken along line VI-VI' of FIG. 12.

FIG. 12 is a top plan view illustrating other embodiments of the inventive concept, FIG. 13A is a cross-sectional view taken along line V-V' of FIG. 12, and FIG. 13B is a cross-sectional view taken along line VI-VI' of FIG. 12.

Referring to FIGS. 12, 13A and 13B, a device isolation pattern 202 may be disposed on a semiconductor substrate 200 to define a plurality of active areas or areas 204. The semiconductor substrate 200 may be a silicon substrate, a germanium substrate or a silicon-germanium substrate. The active area 204 is a part of the semiconductor substrate 200 which is surrounded by the device isolation pattern 202. The active area 204 may be arranged in a first direction and a second direction. The first direction is perpendicular with the second direction. The active areas 204 are spaced apart along the first and the second directions. The active area 204 extends in a third direction. The third direction is not perpendicular to and is not parallel to the first direction. The third direction may be oblique to the first direction. The active areas 204 arranged in the first direction may form a column, and the active areas 204 arranged in the second direction may form a row. Therefore, the active areas 204 may be arranged in columns and the rows. The active area 204 may be doped with dopants of a first conductivity type. The device isolation pattern 202 may be formed of the same material as the device isolation pattern 102 of the previous embodiments. The first, second and third directions are parallel with the surface of the semiconductor substrate.

A doped region 206 is disposed in each of the active areas 204. The doped region 206 is doped with dopants of a second conductivity type different than the first conductivity type. The doped region 206 may extend along a length of the active area 204. An upper boundary of the doped region 206 may be coplanar with a top surface of the active area 204, and may have the same shape as the top surface of the active area 204. A lower boundary of the doped region 206 may be higher than a bottom surface of the device isolation pattern 202.

A low resistivity conductive pattern 216 is in contact with the doped region 206. The low resistivity conductive pattern 216 is disposed in a recessed region 212. The recessed region 212 has a bottom surface lower than the top surface of the active area 204. The low resistivity conductive pattern 216 may be formed of conductive material having a lower resistivity than the doped region 206. The low resistivity conductive pattern 216 may include the same material as the low resistivity conductive pattern 116 of FIGS. 1, 2A and 2B. The low resistivity conductive pattern 216 and the recessed region 212 may extend in the first direction, such that the low resistivity conductive pattern 216 is in contact with at least a part of the sidewall of the active area 204. The device isolation pattern 202 may include a top surface 203a and a recessed surface 203b which is lower than the top surface 203a. The recessed surface 203b of the device isolation pattern 202 is lower than the top surface of the active area 204. The bottom surface of the recessed region 212 may include the recessed surface 203b of the device isolation pattern 202. The lower boundary of doped region 206 may be lower than the bottom surface of the recessed region 212.

The low resistivity conductive pattern 216 may be disposed in each column to be in contact with a sidewall of the center portion of the active area 204. In this case, an entire top surface of the active area 204 may be one substantially planar surface. The contact surface between the low resistivity conductive pattern 216 and the active area 204 may extend in the third direction. The low resistivity conductive pattern 216 may be disposed between adjacent ones of the active areas 204 in each column. Ends of the low resistivity conductive pattern may be in contact with a pair of the active areas 204, respectively. A plurality of the low resistivity conductive patterns 216 may be disposed in each column. The low resistivity conductive pattern 216 in each column may be arranged along the first direction. Opposing sidewalls of the center part of the active area 204 may be in contact with adjacent ones of the low resistivity conductive patterns 216 in each column, respectively. The center part of the active area 204 and the low resistivity conductive pattern 216 in each column may be composed of a signal line such as a bit line.

A pair of channel pillars 226 may be disposed on opposite edges of the top surface of each active area 204, respectively. Thus, the center part of the active area 204 (which is in contact with the low resistivity conductive pattern 216) may be disposed between the pair of the channel pillars 226. The channel pillars 226 are in contact with the doped region 206. The channel pillars 226 may be formed of semiconductor material. For example, the channel pillars 226 may be formed of the same material as the active area 204. The channel pillars 226 may be formed in a single-crystalline state. The channel pillars 226 may be doped with dopants of a different conductivity type than that of the doped region 206, or may be undoped in some embodiments. A pair of channel pillar rows may be arranged in each of the rows including the active areas 204. Each of the channel pillar rows may include a plurality of the channel pillars 216 which are arranged in the second direction.

A pair of gate electrodes 230a may surround the sidewalls of the pair of the channel pillars 226 on each of the active areas 204, respectively. The pair of gate electrodes 230a are spaced apart from each other along the first direction. The pair of gate electrodes 230a may be arranged in parallel and may extend in the second direction. One gate electrode of the pair of the gate electrodes 230a may surround sidewalls of channel pillars 216 which are included in one channel pillar row of the pair of the channel pillar rows, and another gate electrode of the pair of the gate electrodes 230a may surround sidewalls of channel pillars 216 which are included in another channel pillar row of the pair of the channel pillar rows. A gate dielectric layer 228 is interposed between the gate electrode 230a and the channel pillar 216. The gate dielectric layer 228 may be formed of the same material as the gate dielectric layer 128 of FIGS. 2A and 2B.

An insulating layer 218 may be disposed between the gate electrode 230a and the active area 204, between the gate electrode 230a and the low resistivity conductive pattern 216, and between the gate electrode 230a and the top surface of the device isolation pattern 202. The insulating layer 218 may be formed of the same material as the insulating layer 118 of FIGS. 2A and 2B. The channel pillar 226 may be in contact with the top surface of the active area 204, and may extend through the insulating layer 218. A hard mask pattern 201 may be disposed on the top surface of the active area 204. The hard mask pattern 201 may be disposed between the insulating layer 128 and the top surface of the active area 204. The channel pillar 226 may penetrate through the insulating layer 128 and the hard mask pattern 201 to be in contact with the top surface of the active area 204. The top surface 203a of the device isolation pattern 202 may be coplanar with the top surface of the low resistivity conductive pattern 216. In addition, the top surface 203a of the device isolation pattern 202 may be coplanar with a top surface of the hard mask pattern 201. The hard mask pattern 201 may include the same material as the hard mask pattern 101 of FIGS. 2A and 2B. A hole spacer 224 may be disposed between the insulating layer 218 and the channel pillar 216, and between the hard mask pattern 201 and the channel pillar 216. The hole spacer 224 may be formed of the same material as the hole spacer 124 of FIGS. 2A and 2B.

The channel pillar 216 may include a protrusion which is higher than the top surface of the gate electrode 230a. Thus, the top surface of the channel pillar 216 may be higher than the top surface of the gate electrode 230a. A capping insulating pattern 232a may be disposed on the gate electrode 230a. The capping insulating pattern 232a may be disposed on the entire top surface of the gate electrode 230a. The capping insulating pattern 232a may surround the protrusion of the channel pillar 216. The capping insulating pattern 232a has a sidewall which is aligned with the sidewall of the gate electrode 230a. The gate dielectric layer 228 extends upward to be disposed between the capping insulating pattern 232a and the sidewall of the protrusion. The capping insulating pattern 232a may include the same material as the capping insulating pattern 132a of FIGS. 2A and 2B.

The gate electrode 230a may include a first part and a second part. The first part of the gate electrode 230a surrounds the sidewall of the channel pillar 216, and has a first width in the first direction. The second part of the gate electrode 230a is disposed beside the first part of the gate electrode 230a, and has a second width in the first direction. The first width may be wider than the second width. The second part of the gate electrode 230a may be disposed over the low resistivity conductive pattern 216.

An interlayer dielectric layer 236 fills the spaces between the gate electrodes 230a. The interlayer dielectric layer 236 may be disposed between the channel pillars 216 (which are surrounded by one gate electrode 230a) to fill the space surrounded by the capping insulating pattern 230a. The top surface of the inter layer dielectric layer 236 may be substantially level with the top surface of the channel pillar 216, or higher than the top surface of the channel pillar 216 in some embodiments. The interlayer dielectric layer 236 may be formed of oxide.

A data storage element DSE is electrically connected to the top surface of each channel pillar 226. A source/drain region 238 may be disposed in the upper part of the channel pillar 226. The source/drain region 238 may be doped with dopants of the second conductivity type. The data storage element DSE may be connected to the source/drain region 238. The data storage element DSE may be of various types. The data storage element DSE may be replaced by the data storage elements DSE' or DSE" of FIG. 3A or 3B in some embodiments. Alternatively, the data storage element DSE may be of other types, such as those discussed above with reference to the first embodiment.

According to the above embodiment, the doped region 206 is in contact with the low resistivity conductive pattern 216, thereby reducing resistance and enabling of higher speed operation. In addition, as the low resistivity conductive pattern 216 is disposed in the recessed region in the device isolation pattern 202, a step difference is not formed, allowing for a higher degree of high integration.

Figure 14:
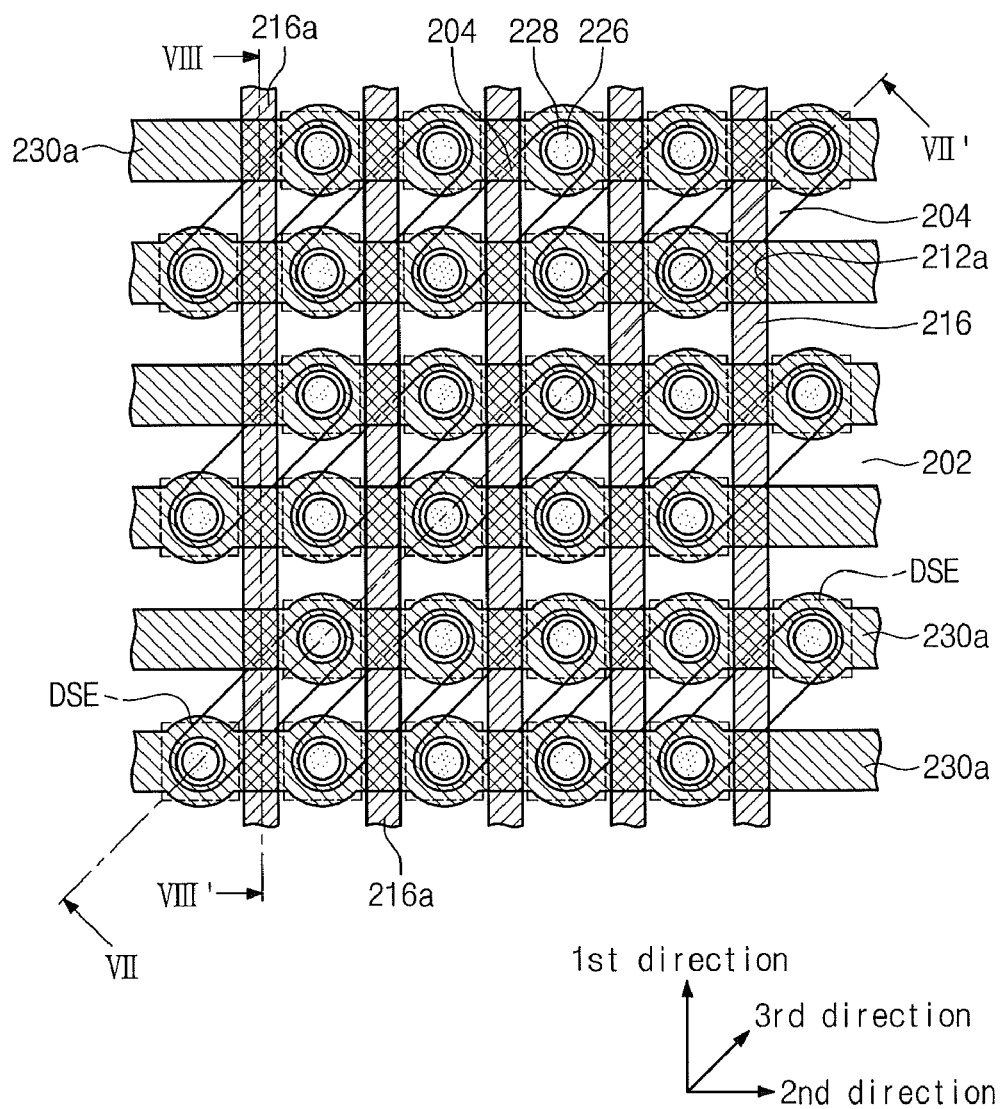
FIG. 14 is a top plan view illustrating still other embodiment of the inventive concepts where recessed regions and low resistivity conductive pattern are formed in other types.
Figure 15A:
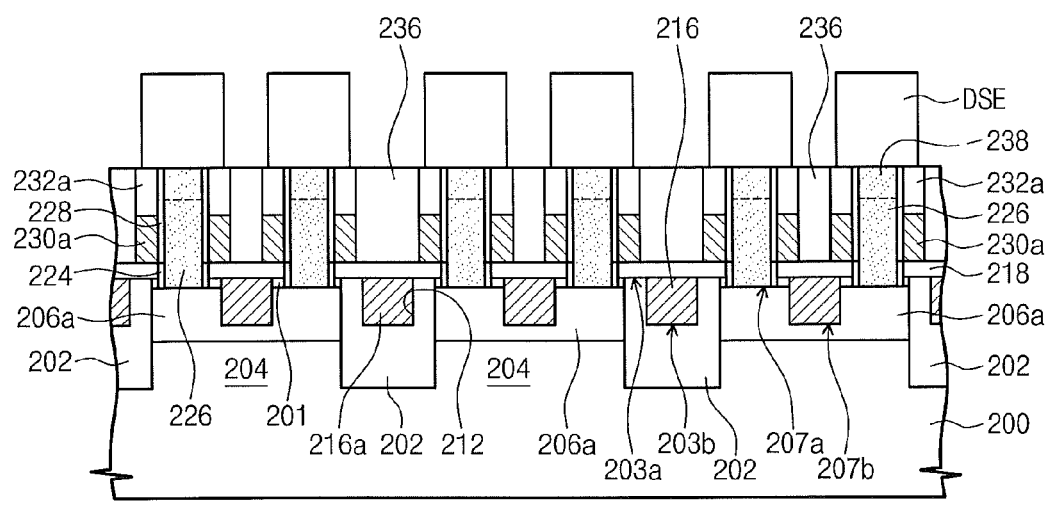
FIG. 15A is a cross-sectional view taken along VII-VII' of FIG. 14.

FIG. 14 is a top plan view illustrating another embodiment of the inventive concept where other configurations of the recessed regions and low resistivity conductive pattern are formed. FIG. 15A is a cross-sectional view taken along VII-VII' of FIG. 14, and FIG. 15B is a cross-sectional view taken along VIII-VIII' of FIG. 14.

Figure 15B:
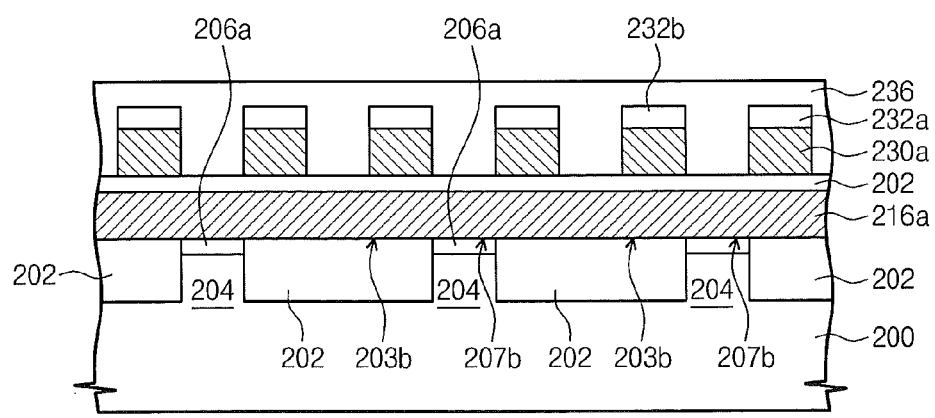
FIG. 15B is a cross-sectional view taken along of FIG. 14.

Referring to FIGS. 14, 15B and 15B, a low resistivity conductive pattern 216a is disposed in the recessed region 212a which has a bottom surface lower than the top surface 207a of the active area 204. The low resistivity conductive pattern 216a is in contact with a doped region 206a in the active area 204. The bottom surface of the recessed region 212a may be higher than the lower boundary of the doped region 206a. The recessed region 212a and the low resistivity conductive pattern 216a may extend in the first direction to penetrate through the center portion of the active area 204. One of the low resistivity conductive patterns 216a may extend in the first direction to penetrate through a plurality of the active areas 204 in each column. The recessed region 212a penetrates through the active area 204 so that the active area 204 includes a recessed surface 207b which is lower than the top surface 207a of the active area 204. The recessed surface 207b of the active area 204 may be higher than the lower boundary of the doped region 206a. The bottom surface of the recessed region 212a may include the recessed surface 207b of the active area 204 and the recessed surface 203b of the device isolation pattern 202. The recessed surface 207b of the active area 204 and the recessed surface 203b of the device isolation pattern 202 may be at substantially the same level. The recessed region 212a may include a first part in the active area 204 and a second part in the device isolation pattern 202. Both inner sidewalls and bottom surfaces of the first part of the recessed region 212a may be defined by the active area 204 in the doped region 206. Both inner sidewalls and the bottom surfaces of the second part of the recessed region 212a may be defined by the device isolation pattern 202.

The low resistivity conductive pattern 216a may also include a first part and a second part. The first part and the second part of the low resistivity conductive pattern 216a may be disposed in the first part and the second part of the recessed region 212a, respectively. The first part of the low resistivity conductive pattern 216a is in contact with both inner sidewalls and the bottom surface of the first part of the recessed region 212a, such that the contact surface between the low resistivity conductive pattern 216a and the doped region 206a can be enlarged.

As described above, one of the low resistivity conductive patterns 216a may be in contact with a plurality of the active areas 204 (and thus, doped regions 206a) in each column. A plurality of the low resistivity conductive patterns 216a may be disposed in the semiconductor substrate to correspond with a plurality of the columns, respectively. The doped region 206a is doped with dopants of the second conductivity type. The low resistivity conductive pattern 216a includes conductive material which has a lower resistivity than the doped region 206a. The low resistivity conductive pattern 216a may include the same material as the low resistivity conductive pattern 116 of FIGS. 1, 2A and 2B.

FIGS. 16A through 20A are cross-sectional views taken along line V-V' of FIG. 12, illustrating a method of fabricating a semiconductor device according to other embodiments of the inventive concept, FIGS. 16B through 20B are cross-sectional views taken along line VI-VI', illustrating a method of fabricating a semiconductor device according to other embodiments of the inventive concept.

Figure 16A:
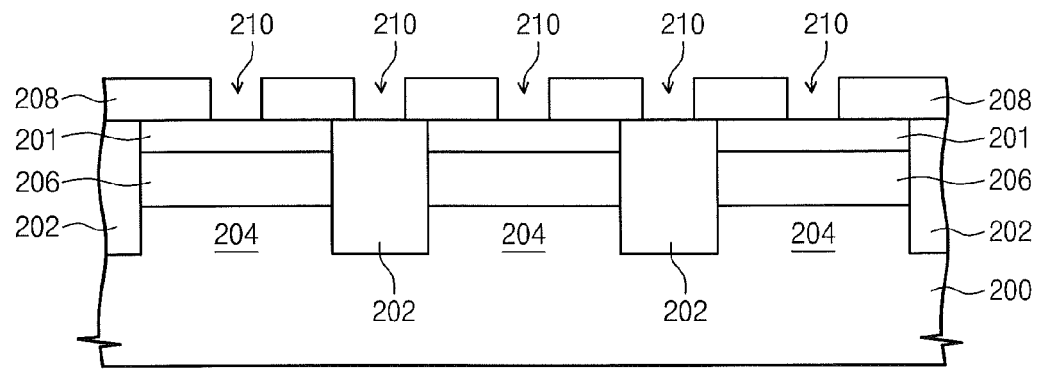
Figure 16B:
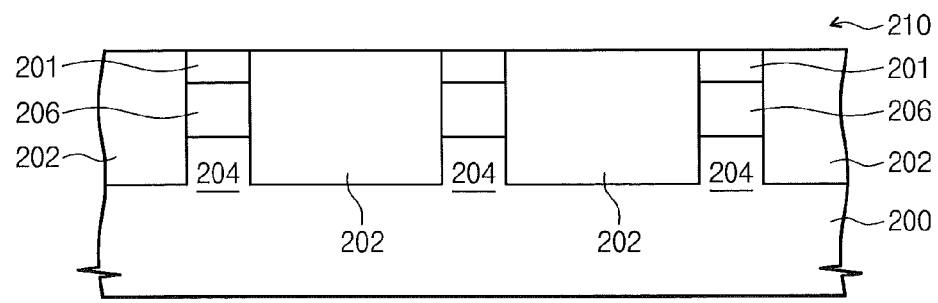

Referring to FIGS. 16A and 16B, hard mask patterns 201 may be formed on a semiconductor substrate 200 to define active areas 204. The semiconductor substrate 200 may be etched using the hard mask patterns 201 as etch masks to form trenches which define the active areas 204. A device isolation pattern 202 may be formed to fill the trenches. The active areas 204 may be doped with dopants of a first conductivity type. The hard mask pattern 201 may be formed of insulator which has etching selectivity with respect to the semiconductor substrate 200. The hard mask pattern 201 may be formed of the same material as the hard mask pattern 101 of FIG. 8A. The device isolation pattern 202 may be formed by the same or similar method and formed of the same material as the device isolation pattern 102 of FIG. 8A. The top surface of the hard mask pattern 201 may be coplanar with the top surface of the device isolation pattern 202.

A doped region 206 may be formed in each of the active areas 204. The doped region 206 is doped with dopants of a second conductivity type. The doped region 206 may be formed by the same method of forming the doped region 106 of FIG. 8A. For example, the doped region 206 may be formed after forming the active area 204 or simultaneously with the active area 204.

A mask pattern 208 having openings 210 may be formed on the semiconductor substrate 200 having the device isolation pattern 202.

The opening 210 may overlap with a part of the device isolation pattern 202 and a part of the active area 204 which is adjacent to the device isolation pattern 202. The hard mask pattern 201 on the active area 204 and the device isolation pattern 202 are exposed by the opening 210. A central part of the active area 204 may overlap with the opening 210. The opening 210 may be formed of a groove shape which extends in the first direction of FIG. 12. Each opening 210 crosses over active areas 204 which are disposed in each column of FIG. 12.

Figure 17A:
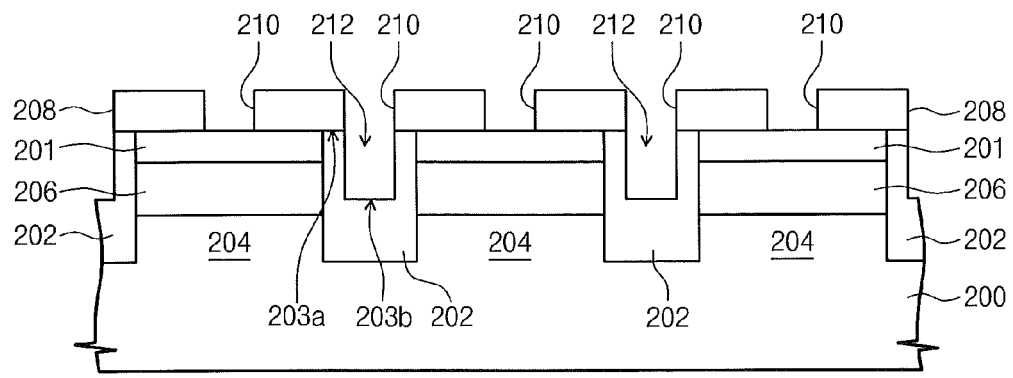
Figure 17B:
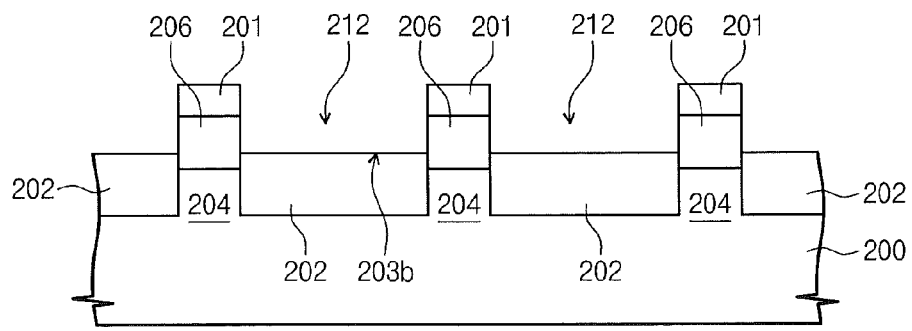

Referring to FIGS. 17A and 17B, the device isolation pattern 202 which is exposed by the opening 210 may be etched using the mask pattern 208 as an etch mask to form a recessed region 212 in the device isolation pattern 202. A recessed surface 203b may be formed in the device isolation pattern 202 by the etching of the device isolation pattern 202. The recessed surface 203b of the device isolation pattern 202 is lower than the top surface 203a of the device isolation pattern 202, and corresponds to the bottom surface of the recessed region 212. A sidewall of the center part of the active area 204 is exposed on an inner surface of the recessed region 212. In the etching process, the hard mask pattern 201 exposed in the opening 210 may be used as an etch mask. That is to say, the device isolation pattern 202 may be etched without substantially etching the active area that overlaps with the opening 210. The etch rates of the hard mask pattern 201 and the active area 204 may be lower than that of the device isolation pattern 202 in the etching process.

Figure 18A:
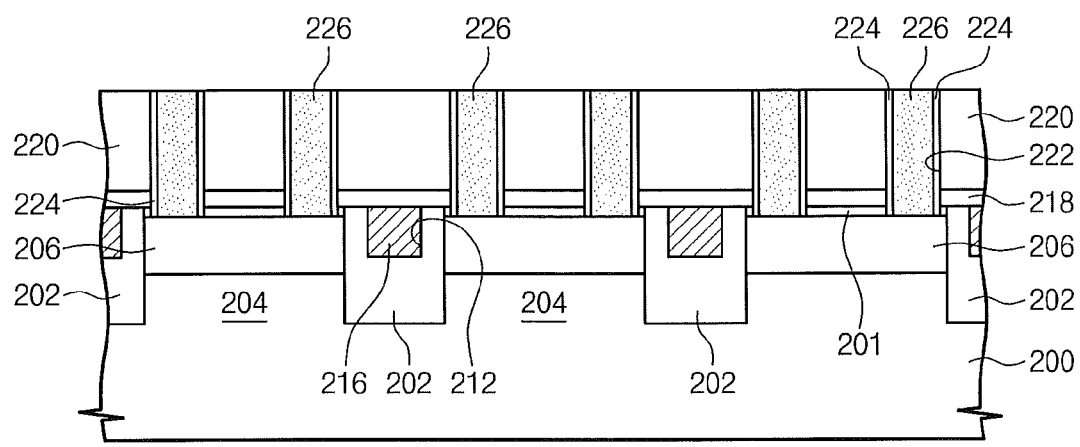
Figure 18B:
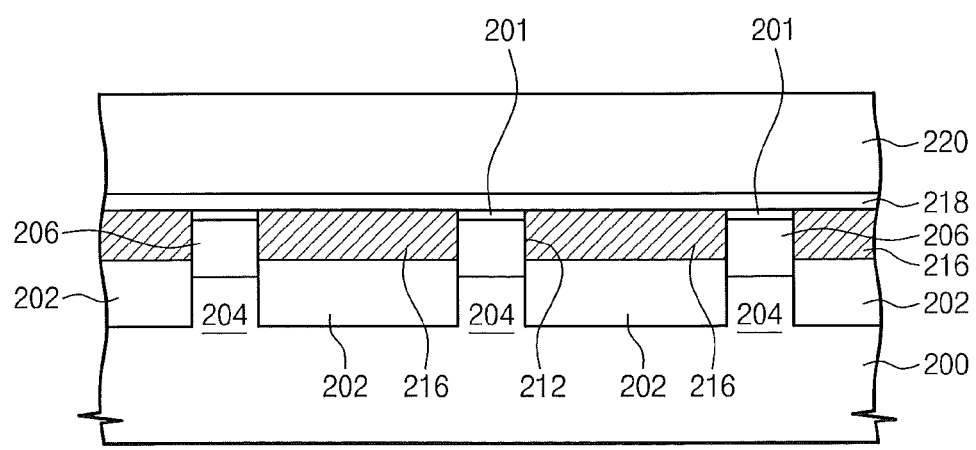

Referring to FIGS. 18A and 18B, the mask pattern 208 may be removed and a low resistivity conductive layer may be formed on the semiconductor substrate 200 to fill the recessed region 212. The low resistivity conductive layer may be formed by the same method of forming the low resistivity conductive layer 114 of FIG. 8D. The low resistivity conductive layer may be planarized until the hard mask pattern 201 and the device isolation pattern 202 are exposed to form a low resistivity conductive pattern 216 in the recessed region 212. In the planarization process, a part of the hard mask pattern 201 and a part of the device isolation pattern may also be planarized.

Subsequently, an insulating layer 218 and a mold layer 220 may be sequentially formed on the semiconductor substrate 200. The mold layer 220, the insulating layer 218 and the hard mask pattern 201 may be sequentially patterned to form holes 222 exposing top surfaces of each of the active areas 204. The insulating layer 218 may be formed of insulating material with etching selectivity with respect to the mold layer 220. The mold layer 220 may be formed of an oxide layer, and the insulating layer 218 may be formed of a nitride layer and/or an oxynitride layer.

A hole spacer 224 may be formed on the sidewalls of each of the holes 222. The hole spacers 224 may be formed of oxide, nitride and/or oxynitride. Subsequently, a channel pillar 226 is formed in each of the holes 222. The channel pillars 226 are in contact with the top surfaces of the active areas 204 which are exposed by the holes 222. The width of the channel pillar 226 may be adjusted by the hole spacers 224, thereby improving the alignment margin between the channel pillars 226 and the active areas 204. The channel pillars 226 may be formed of single-crystalline semiconductor material. The channel pillars 226 may be formed by the same method as the channel pillar 126 of FIG. 8G. For example, the channel pillars 226 may be formed in a selective epitaxial growth process. Alternatively, the channel pillars 226 may be formed in a process in which an amorphous or poly crystalline semiconductor layer is deposited, the deposited semiconductor layer is thermal treated to be changed into a mono crystalline state, and the semiconductor layer outside of the holes 222 is removed.

Figure 19A:
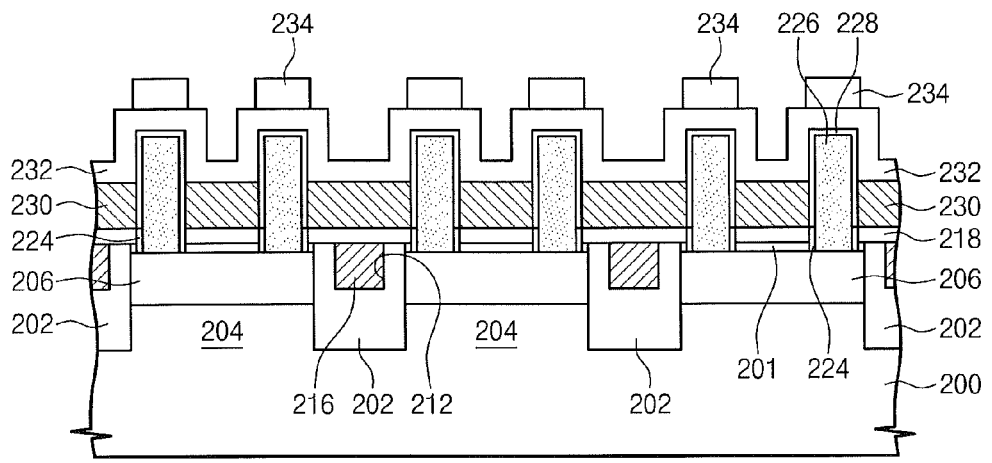
Figure 19B:
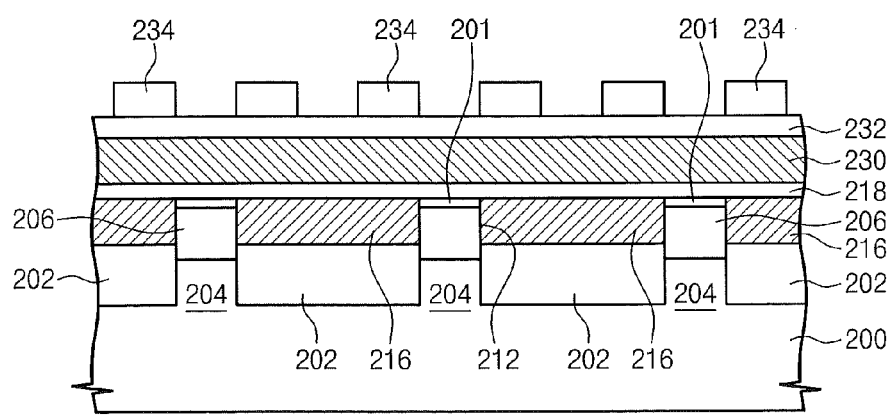

Referring to FIGS. 19A and 19B, the mold layer 220 and the hole spacers 224 may be removed to expose a surface (i.e. a sidewalls) of the channel pillars 226. The mold layer 220 and the hole spacers 224 may be removed by an isotropic etching process such as a wet etching. The insulating layer 218 may remain. A part of the hole spacers 224 between the channel pillar 226 and the insulating layer 218 may also remain. A gate dielectric layer 228 is formed on the surface of the channel pillar 226. The gate dielectric layer 228 may be formed in a thermal oxidation process, a thermal oxynitridation process and/or a nitridation process. Subsequently, a gate conductive layer is formed on the semiconductor substrate 200, and the gate conductive layer may be planarized using the gate dielectric layer 228 on the top surface of the channel pillars 226 as an etching stop layer. A top surface of the planarized gate conductive layer may be recessed to be lower than the top surface of the channel pillar 226. Therefore, the channel pillars 226 may each include a protrusion which is higher than the top surface of the recessed gate conductive layer 230.

Subsequently, a capping insulating layer 232 may be conformally formed on the semiconductor substrate 200, and a gate mask pattern 234 for defining a gate electrode is formed on the capping insulating layer 232. The gate mask pattern 234 may have a substantially uniform width. As in the gate mask pattern 134 of FIGS. 8I and 9A, the width of the gate mask pattern 234 may be narrower than the width of the capping insulating layer 232 surrounding the protrusions of the channel pillars 226. The gate mask pattern 234 may be formed of material with etching selectivity to the capping insulating layer 232 and the gate conductive layer 230. For example, the gate mask pattern 234 may be formed of a photo resist layer.

Figure 20A:
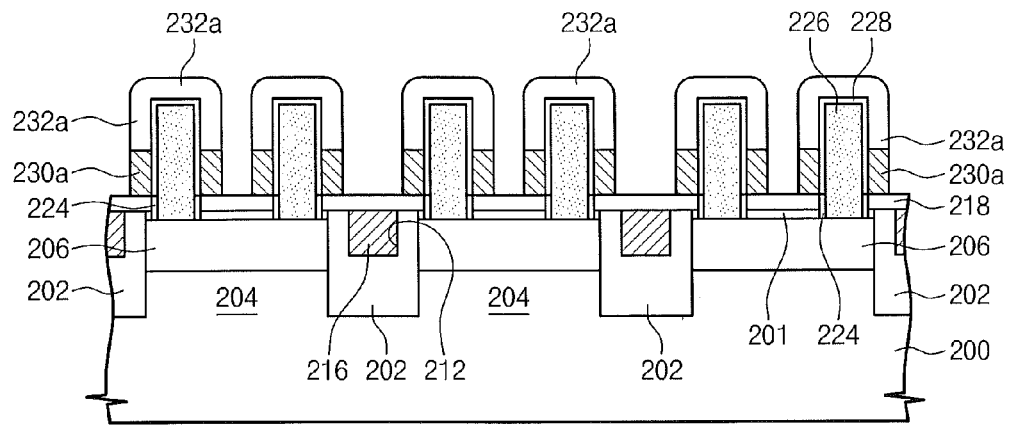
Figure 20B:
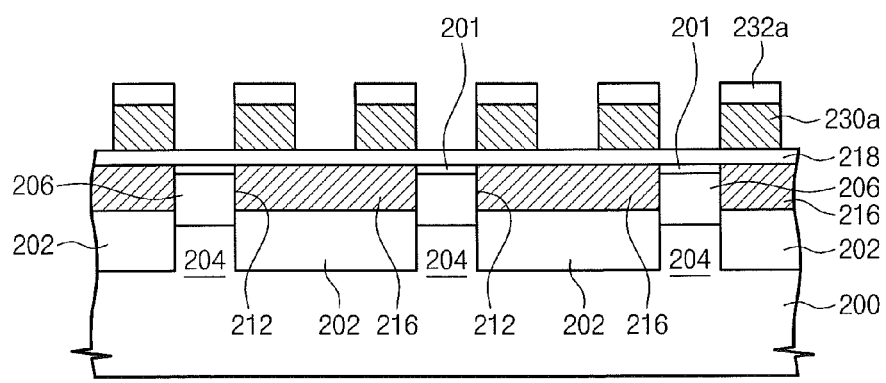

Referring to FIGS. 20A and 20B, the capping insulating layer 232 and the gate conductive layer 230 may be successively etched using the gate mask pattern 234 as an etching mask to form a gate electrode 230a and a capping insulating pattern 232a which are sequentially stacked. Since the width of the gate mask pattern 234 is narrower than the width of the capping insulating layer 132 surrounding the protrusions of the channel pillars 226, the gate electrode 230a may include a first part with a first width and a second part with a second width narrower than the first width. The first part of the gate electrode 230a surrounds the channel pillars 226. The capping insulating pattern 232a may cover the top surfaces of the channel pillars 226.

Subsequently, the gate mask pattern 234 may be removed, and an interlayer dielectric layer may be formed on the entire surface of the semiconductor substrate 200. The interlayer dielectric layer may be planarized until the capping insulating pattern 232a on the top surfaces of the channel pillars 226 is exposed. As a result, the interlayer dielectric layer 236 of FIGS. 13A and 13B can be formed. The capping insulating pattern 232a and the gate dielectric layer 228 on the top surface of the channel pillars 226 may also be removed to expose the top surfaces of the channel pillars 226. The planarizing of the interlayer dielectric layer, the removing of the capping insulating pattern 232a on the channel pillars 226, and the removing of the gate dielectric layer 228 on the channel pillars 226 may be performed using a selective etching process. In this case, the top surface of the interlayer dielectric layer 236 may be higher than the top surfaces of the channel pillars 226. Alternatively, the interlayer dielectric layer 236, the capping insulating pattern 232a and the gate dielectric layer 228 may be successively planarized in a chemical mechanical polishing (CMP) process. In this case, as shown in FIGS. 13A and 13B, the planarized top surface of the interlayer dielectric layer 236, the top surfaces of the channel pillars 226 and the top surface of the capping insulating pattern 232a surrounding the protrusions of the channel pillars 226 may be coplanar with each other.

Dopants of a second conductivity type may be injected into the upper part of the channel pillars 226 to form the source/drain regions 238 of FIGS. 13A and 13A. The source/drain regions 238 may be formed after removing the capping insulating pattern 132a on the channel pillars 226. Alternatively, the source/drain regions 238 may be formed between the forming of the channel pillars 226 in the holes 222 of FIGS. 18A and 18B and the removing of the mold layer 220. Data storage elements DSE connected to the top surfaces of the exposed channel pillars 226 may be formed. The data storage elements DSE may be formed by the methods of forming the data storage element DSE' of FIG. 3A or DSE" of FIG. 3B. As a result, the semiconductor device of FIGS. 12, 13A and 13B is fabricated.

Methods for fabricating a semiconductor device of FIGS. 14, 15A and 15B will now be described. These methods may include the methods which have been described with reference to FIGS. 16A and 16B.

Figure 21A:
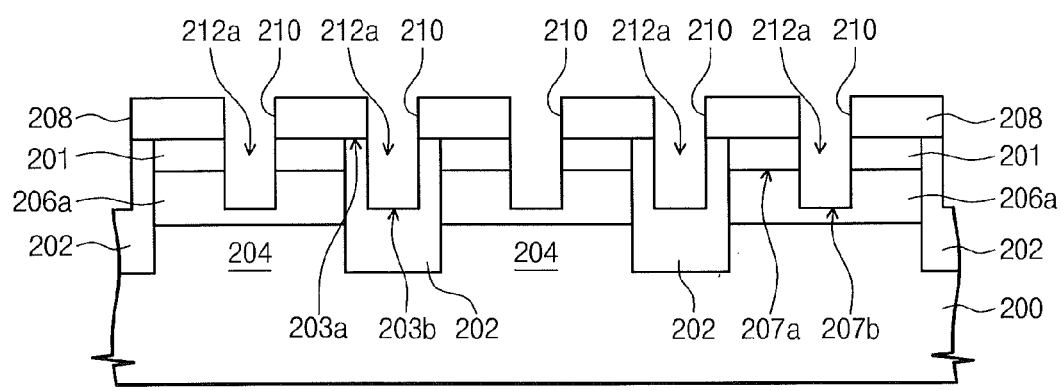
FIG. 21A is a cross-sectional view taken along line VII-VII' of FIG. 14, illustrating a method of fabricating the semiconductor device of FIG. 14.
Figure 21B:
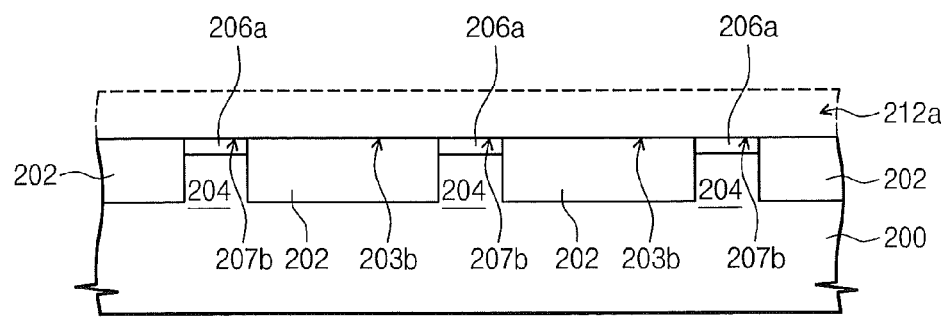
FIG. 21B is a cross-sectional view taken along line VIII-VIII' of FIG. 14, illustrating a method of fabricating the semiconductor device of FIG. 14.

FIG. 21A is a cross-sectional view taken along line VII-VII' of FIG. 14, illustrating a method of fabricating the semiconductor device of FIG. 14, and FIG. 21B is a cross-sectional view taken along line VIII-VIII' of FIG. 14, illustrating a method of fabricating the semiconductor device of FIG. 14 according to some embodiments.

Referring to FIGS. 16A, 16B, 21A and 21B, an active area 204 and a device isolation pattern 202 that overlaps with the opening 210 may be etched using the mask pattern 208 as an etch mask to form a recessed region 212a. In the etching process, the hard mask pattern 201 exposed in the opening 210 may be etched. The etch rate of the active area 204 by the etching process may be the same as that of the device isolation pattern 202 by the etching process. The etch rate of the active area 204 may also be the same as that of the hard mask pattern 201 in this etching process.

Successive processes may be performed in a similar fashion as described with reference to FIGS. 18A through 20A, and 18B through 20B. As a result, the semiconductor device of FIGS. 14, 15A and 15B can be fabricated.

According to embodiments of the inventive concept, a channel pillar is in contact with a top surface of an active area, and is formed in a single-crystalline state. Also, a doped region, which is connected to the bottom surface of the channel pillar, is in contact with a low resistivity conductive pattern in a recessed region which has a bottom surface lower than the top surface of the active area. The resistance of the doped region can be reduced by the low resistivity conductive pattern. Thereby, vertical field effect transistors (FETs) can be fabricated, which may have improved characteristics and may be capable of higher speed operation. The vertical FETs may also be highly integrated. Therefore, semiconductor devices having vertical FETs according to some embodiments can be capable of high speed operation while providing a high degree of integration.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the following claims.

That which is claimed:

1. An integrated circuit device, comprising:
a substrate;
a device isolation pattern on the substrate defining an active area therein, the active area including a doped region therein;

a conductive pattern extending on the active area and electrically contacting the doped region, the conductive pattern having a lower resistivity than the doped region, wherein the conductive pattern is disposed in a recessed region having a bottom surface that is lower than a top surface of the active area;

a channel pillar electrically contacting the doped region and extending therefrom in a direction away from the substrate;

a conductive gate electrode on a sidewall of the channel pillar; and a gate dielectric layer between the gate electrode and the sidewall of the channel pillar.

2. The device of claim 1, wherein the doped region, the recessed region, and the conductive pattern extend in a first direction, and wherein the gate electrode extends in a second direction substantially perpendicular to the first direction.

3. The device of claim 1, wherein the conductive pattern comprises an upper surface and a lower surface, wherein the lower surface of the conductive pattern is below a top surface of the device isolation pattern and the top surface of the active area, and wherein the bottom surface of the recessed region comprises a recessed surface of the device isolation pattern.

4. The device of claim 3, wherein the active area comprises a recessed surface lower than the top surface of the active area, and wherein the bottom surface of the recessed region includes the recessed surface of the device isolation pattern and the recessed surface of the active area.

5. The device of claim 4, wherein the recessed region comprises a first sidewall extending between the top and recessed surfaces of the device isolation pattern, and a second sidewall extending between the top and recessed surfaces of the active area, and further comprising:

first and second sidewall spacers electrically separating the conductive pattern from the first and second sidewalls of the recessed region, respectively, such that the conductive pattern contacts the recessed surface of the active area and the recessed surface of the device isolation pattern.

6. The device of claim 1, wherein the active area includes a recessed surface lower than the top surface of the active area, and wherein the bottom surface of the recessed region comprises the recessed surface of the active area.

7. The device of claim 1, wherein the recessed region and the conductive pattern extend in a first direction, wherein the gate electrode extends in a second direction substantially perpendicular to the first direction, and wherein the doped region and the active area extend in a third direction that is not perpendicular to the first direction and is not parallel to the first direction.

8. The device of claim 7, wherein the device isolation pattern includes a top surface and a recessed surface, wherein the recessed surface of the device isolation pattern is lower than the top surface of the device isolation pattern and the top surface of the active area, and wherein the bottom surface of the recessed region comprises the recessed surface of the device isolation pattern.

9. The device of claim 8, wherein the conductive pattern is in contact with a sidewall of the active area, and wherein an entirety of the top surface of the active area comprises a substantially planar surface.

10. The device of claim 8, wherein the recessed region and the conductive pattern extend in the first direction across the active area, wherein the active area includes a recessed surface lower than the top surface thereof, and wherein the bottom surface of the recessed region further comprises the recessed surface of the active area.

11. The device of claim 1, further comprising:

an insulating layer electrically isolating the gate electrode and the active area, and electrically isolating the gate electrode and the conductive pattern.

12. An integrated circuit device, comprising:

a substrate;

a device isolation pattern on the substrate defining an active area therein, the active area including a doped region therein;

a conductive pattern extending on the active area and electrically contacting the doped region, the conductive pattern having a lower resistivity than the doped region;

a channel pillar electrically contacting the doped region and extending therefrom in a direction away from the substrate;

a conductive gate electrode on a sidewall of the channel pillar;

a gate dielectric layer between the gate electrode and the sidewall of the channel pillar; and a hard mask pattern on a top surface of the active area, wherein the channel pillar contacts the top surface of the active area and extends through the hard mask pattern, and wherein a top surface of the hard mask pattern is substantially coplanar with a top surface of the conductive pattern and with a top surface of the device isolation pattern.

13. The device of claim 1, wherein the gate electrode comprises a first portion and a second portion adjacent thereto extending in a first direction, wherein the first portion surrounds the channel pillar and has a first width along a second direction substantially perpendicular to the first direction, and wherein the second portion has a second width narrower than the first width along the second direction.

14. The device of claim 1, wherein the doped region has a lower boundary opposite the top surface of the active area, and wherein the lower boundary of the doped region is below the bottom surface of the recessed region.

15. An integrated circuit device, comprising:

a substrate;

a device isolation pattern on the substrate defining an active area therein, the active area including a doped region therein;

a conductive pattern extending on the active area and electrically contacting the doped region, the conductive pattern having a lower resistivity than the doped region;

a channel pillar electrically contacting the doped region and extending therefrom in a direction away from the substrate;

a conductive gate electrode on a sidewall of the channel pillar;

a gate dielectric layer between the gate electrode and the sidewall of the channel pillar; and a data storage element electrically connected to a top surface of the channel pillar.

16. The device of claim 15, wherein the data storage element comprises one of a capacitor and a variable resistivity memory element.

17. The device of claim 15, wherein the data storage element comprises a resistive random access memory (RRAM) element, a phase changeable random access memory (PRAM) element, and/or a magnetic random access memory (MRAM) element.

18. The device of claim 15, wherein the data storage element comprises a string of serially connected memory cells.

* * * * *